(12) United States Patent
Beer et al.

(10) Patent No.: US 10,008,470 B2
(45) Date of Patent: Jun. 26, 2018

(54) EMBEDDED CHIP PACKAGES AD METHODS FOR MANUFACTURING AN EMBEDDED CHIP PACKAGE

(71) Applicant: Infineon Technologies AG, Neubiberg (DE)

(72) Inventors: Gottfried Beer, Nittendorf (DE); Walter Hartner, Bad Abbach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days. days.

(21) Appl. No.: 15/628,682

(22) Filed: Jun. 21, 2017

(65) Prior Publication Data

US 2017/0288176 A1   Oct. 5, 2017

Related U.S. Application Data

(63) Continuation of application No. 13/736,097, filed on Jan. 8, 2013, now Pat. No. 9,721,920.

(30) Foreign Application Priority Data

Oct. 19, 2012   (EP) .................................... 12007249

(51) Int. Cl.
*H01L 21/00* (2006.01)
*H01L 21/4763* (2006.01)
(Continued)

(52) U.S. Cl.
CPC .............. *H01L 24/82* (2013.01); *H01L 21/78* (2013.01); *H01L 23/5384* (2013.01); *H01L 23/5389* (2013.01); *H01L 24/19* (2013.01); *H01L 24/24* (2013.01); *H01L 24/96* (2013.01); *H01L 24/97* (2013.01); *H01Q 1/2283* (2013.01); *H01Q 23/00* (2013.01); *H01L 21/568* (2013.01); *H01L 23/3128* (2013.01); *H01L 23/49816* (2013.01); *H01L 23/5226* (2013.01); *H01L 23/66* (2013.01); *H01L 24/16* (2013.01); *H01L 24/32* (2013.01); *H01L 24/48* (2013.01); *H01L 24/73* (2013.01); *H01L 25/105* (2013.01);
(Continued)

(58) Field of Classification Search
CPC ........... H01L 2225/06551; H01L 24/82; H01L 24/83; H01L 21/78; H01L 23/5226
USPC ................ 257/686, 774, 773, 775, E25.013; 438/109, 113, 622
See application file for complete search history.

(56) References Cited

U.S. PATENT DOCUMENTS 7,009,296 B1 *  3/2006  Heo ..................... H01L 23/3128
                                                           257/738
2003/0146012 A1 *  8/2003  Song ................... H01L 25/0657
                                                           174/538

(Continued)

*Primary Examiner* — Fernando L. Toledo
*Assistant Examiner* — Aaron Gray
(74) *Attorney, Agent, or Firm* — Viering Jentschura & Partner MBB

(57) ABSTRACT

A method for manufacturing an embedded chip package is provided. The method may include: forming electrically conductive lines over a substrate; placing the substrate next to a chip arrangement comprising a chip, the chip comprising one or more contact pads, wherein one or more of the electrically conductive lines are arranged proximate to a side wall of the chip; and forming one or more electrical interconnects over the chip arrangement to electrically connect at least one electrically conductive line to at least one contact pad.

17 Claims, 21 Drawing Sheets

(51) Int. Cl.

| | | |
|---|---|---|
| | *H01L 23/02* | (2006.01) |
| | *H01L 23/48* | (2006.01) |
| | *H01L 23/52* | (2006.01) |
| | *H01L 29/40* | (2006.01) |
| | *H01L 23/00* | (2006.01) |
| | *H01L 21/78* | (2006.01) |
| | *H01L 23/538* | (2006.01) |
| | *H01Q 23/00* | (2006.01) |
| | *H01Q 1/22* | (2006.01) |
| | *H01L 23/522* | (2006.01) |
| | *H01L 23/498* | (2006.01) |
| | *H01L 23/66* | (2006.01) |
| | *H01L 25/16* | (2006.01) |
| | *H01L 23/31* | (2006.01) |
| | *H01L 25/10* | (2006.01) |
| | *H01L 21/56* | (2006.01) |

(52) U.S. Cl.
CPC ...... *H01L 25/16* (2013.01); *H01L 2223/6627* (2013.01); *H01L 2223/6677* (2013.01); *H01L 2223/6683* (2013.01); *H01L 2224/0401* (2013.01); *H01L 2224/04105* (2013.01); *H01L 2224/05599* (2013.01); *H01L 2224/12105* (2013.01); *H01L 2224/16225* (2013.01); *H01L 2224/24195* (2013.01); *H01L 2224/32145* (2013.01); *H01L 2224/32245* (2013.01); *H01L 2224/451* (2013.01); *H01L 2224/45015* (2013.01); *H01L 2224/48227* (2013.01); *H01L 2224/73267* (2013.01); *H01L 2224/97* (2013.01); *H01L 2225/06551* (2013.01); *H01L 2225/06562* (2013.01); *H01L 2225/1035* (2013.01); *H01L 2225/1041* (2013.01); *H01L 2225/1058* (2013.01); *H01L 2924/00014* (2013.01); *H01L 2924/12042* (2013.01); *H01L 2924/1301* (2013.01); *H01L 2924/1423* (2013.01); *H01L 2924/1431* (2013.01); *H01L 2924/1434* (2013.01); *H01L 2924/1461* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/207* (2013.01)

(56) References Cited

U.S. PATENT DOCUMENTS

2009/0045444 A1\* 2/2009 Huebner ............ H01L 23/3121
257/296
2012/0020044 A1 1/2012 Iihola et al.

\* cited by examiner

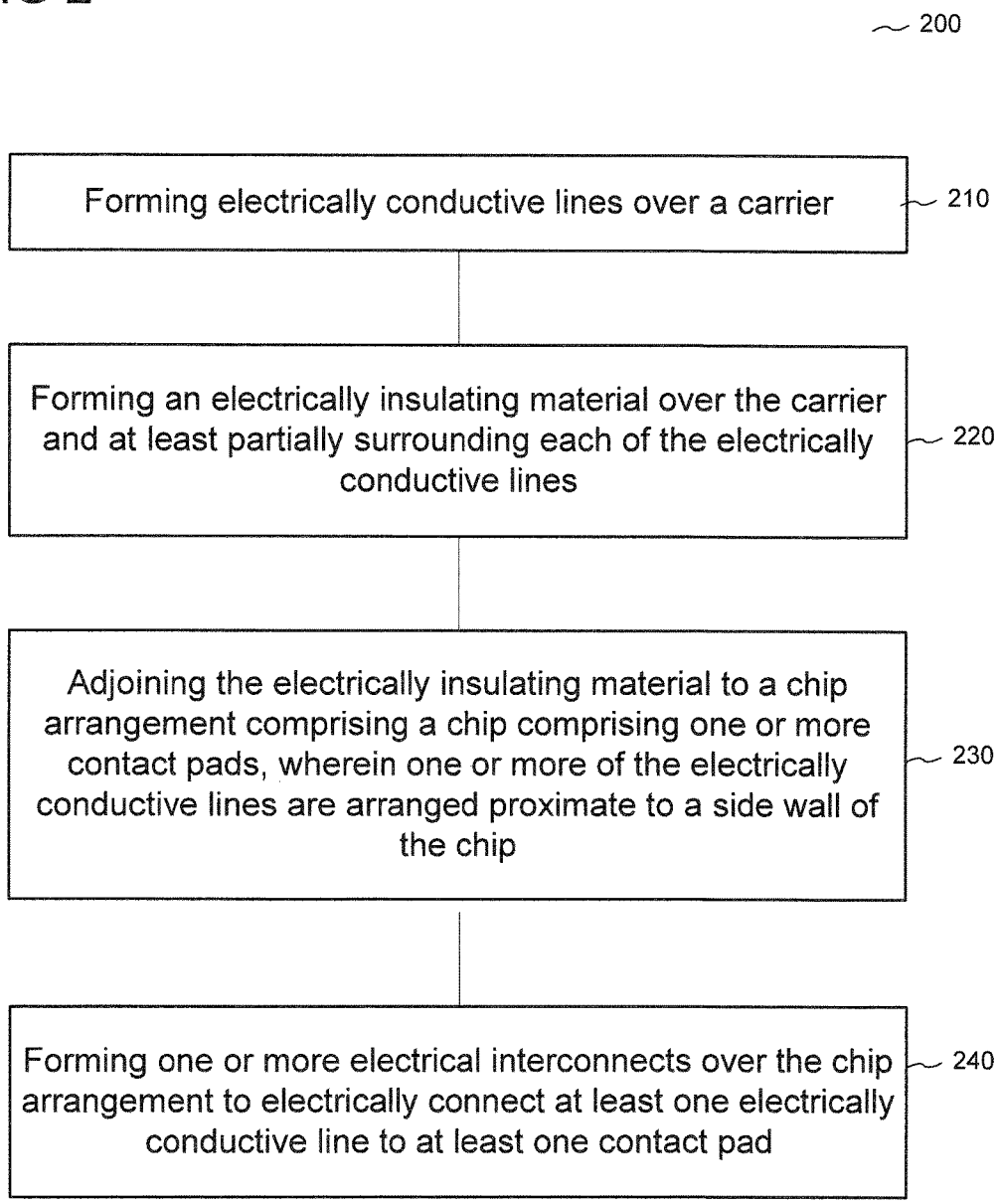

FIG 7A ~ 710
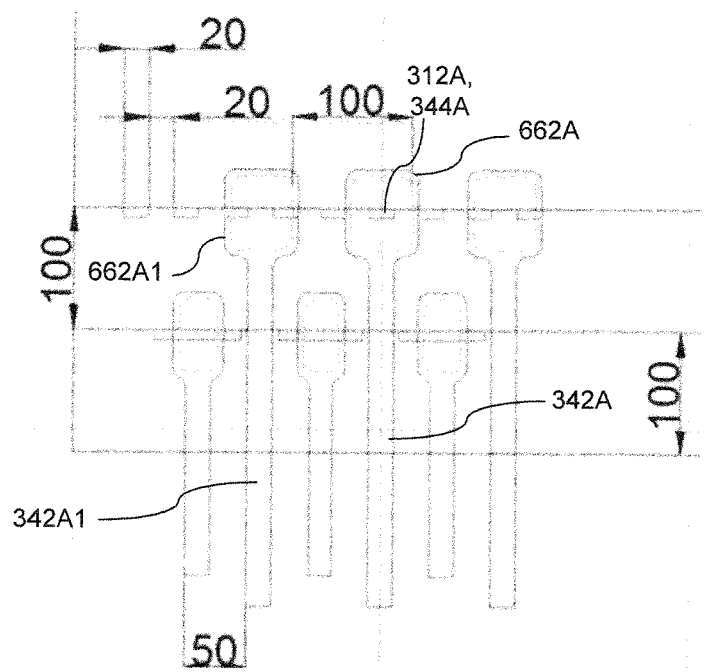
FIG 7B ~ 720
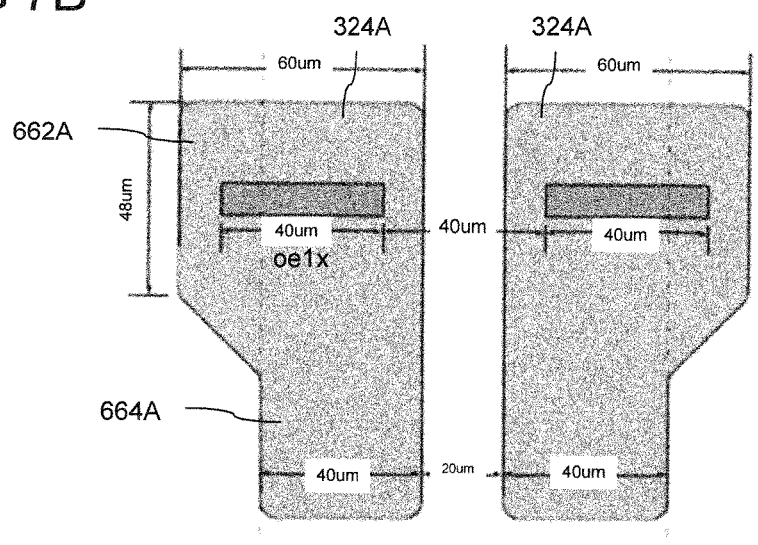

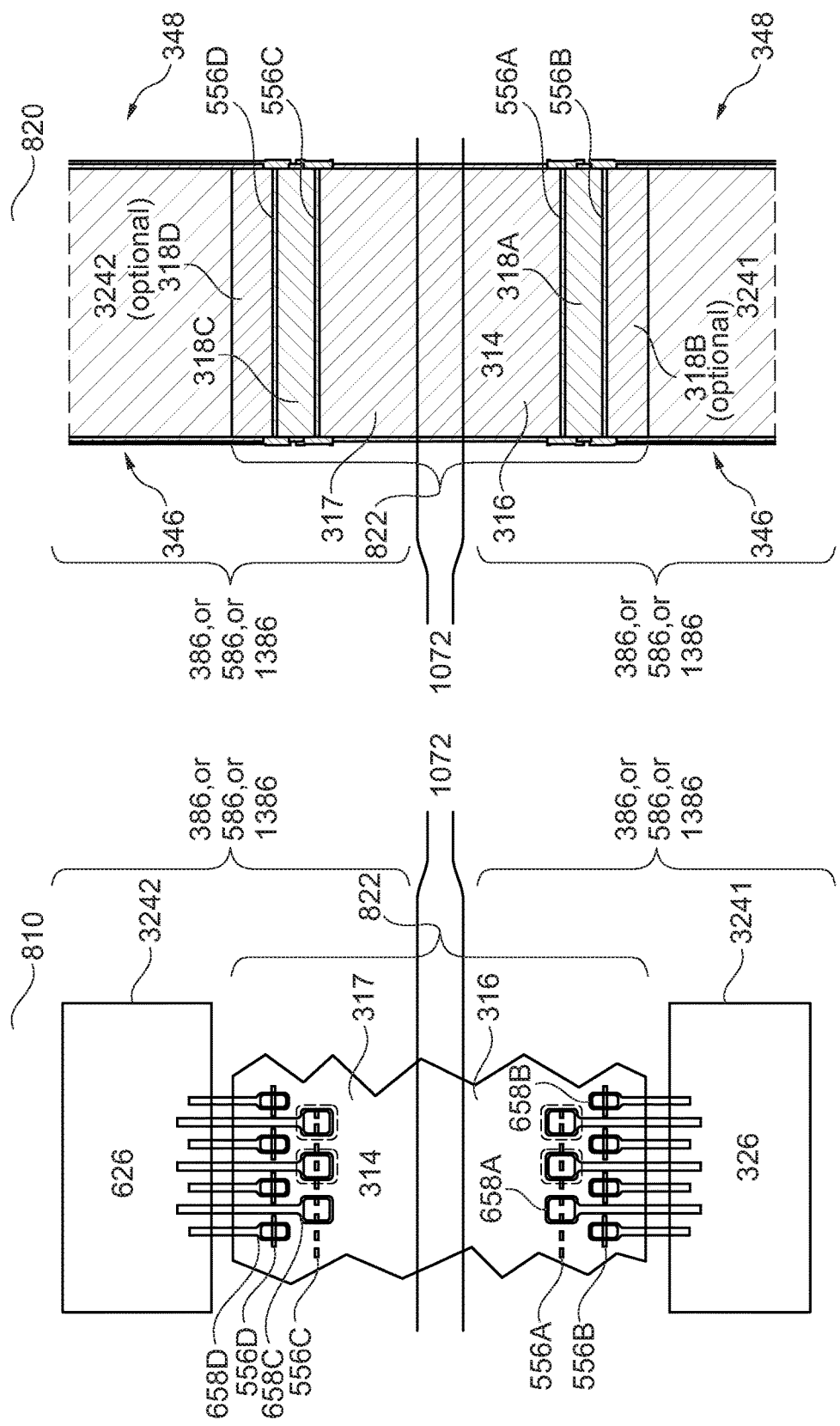

EMBEDDED CHIP PACKAGES AND METHODS FOR MANUFACTURING AN EMBEDDED CHIP PACKAGE

CROSS-REFERENCE TO RELATED APPLICATION

This application is a Continuation Application and claims priority to U.S. application Ser. No. 13/736,097 filed on Jan. 8, 2013; which claims priority to European Patent Application Serial No. 12007249.1, which was filed Oct. 19, 2012; both of which are incorporated herein by reference in their entirety.

TECHNICAL FIELD

Various embodiments relate generally to embedded chip packages and methods for manufacturing an embedded chip package.

BACKGROUND

There are currently a limited number of ways for producing through-encapsulant vias (TEVs).

In some cases, pre-produced via bars 102 may be embedded in encapsulant 104 using a simple process sequence at an embedding level, like dice as shown in FIG. 1. As shown in FIG. 1, the woven glass fiber of the embedded via bar 102 is visible. These via bars 102 may be costly, and moreover, have very limited via density as they may be manufactured using printed circuit board (PCB) technology. The via bars 102 may be simply plugged in the offline PCB production line. Therefore, typical via pitches may be in the range of several hundred micrometers, e.g. about 300 µm. Furthermore, there may be a limited degree of design freedom because the vias may not be located everywhere. Furthermore, usually only a very limited number of via bars may be arranged, for example only one via bar per side.

TEVs may also be formed by forming a hole, i.e. via drilling by a laser. This may be followed by seed layer deposition, and plating in the holes. Wafers having a thickness of about 250 µm may be difficult to handle. While vias may be located everywhere beside the die(s) (not shown), laser drilling through encapsulant material may be challenging, due to the presence of inorganic filler particles in the encapsulant material. Typically achievable via diameters, may generally be larger than about 100 µm, and therefore, via density may also be rather limited. Further, via pitch may be in the range of about 300 µm. The filler particles tend to cause undercuts, thereby making deposition of the seed layer very difficult. Particular with thicker wafers, e.g. 450 µm thick, the aspect ratio of the vias and the undercuts tend to cause interrupted connections in the seed layer. This may lead subsequently to problems will via filling by electroplating, e.g. by electroplating cooper. The discontinuity in the seed layer, may mean that the vias cannot or may not be totally or substantially filled with metal. Plugging may also be difficult, and buried vias may generally not be acceptable.

In other cases, elastic contact elements may be positioned between interposer substrates which surround a semiconductor chip.

SUMMARY

A method for manufacturing an embedded chip package is described. The method may include: forming a first layer of electrically conductive lines over a substrate to form a pre-formed via arrangement; dicing the pre-formed via arrangement in a direction perpendicular to the electrically conductive lines; placing the diced pre-formed via arrangement perpendicularly next to a first side of a chip arrangement comprising a chip, the chip comprising one or more contact pads, wherein one or more of the electrically conductive lines are arranged proximate to a first side wall of the chip; and wherein the diced pre-formed via arrangement is turned to that the electrically conductive lines are facing the first side wall of the chip; and forming one or more electrical interconnects over the chip arrangement to electrically connect at least one electrically conductive line to at least one contact pad.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a method for manufacturing an embedded chip package according to an embodiment;

FIG. 3D shows an embedded chip package according to various embodiments;

FIG. 3E shows an embedded chip package according to various embodiments;

FIG. 5C shows an embedded chip package according to various embodiments;

FIG. 6A shows an embedded chip package according to various embodiments;

FIG. 6B shows an embedded chip package according to various embodiments;

FIGS. 7A to 7D show a method for manufacturing an embedded chip package according to various embodiments;

FIGS. 8A and 8B show a method for manufacturing an embedded chip package according to various embodiments;

DESCRIPTION

The following detailed description refers to the accompanying drawings that show, by way of illustration, specific details and embodiments in which the invention may be practiced.

The word "exemplary" is used herein to mean "serving as an example, instance, or illustration" or the like. Any embodiment or design described herein as "exemplary" is not necessarily to be construed as preferred or advantageous over other embodiments or designs.

The word "over" is used herein to describe forming a feature, e.g. a layer, "over" a side or surface, and may be used to mean that the feature, e.g. the layer may be formed "directly on," e.g. in direct contact with, the implied side or surface. The word "over" may also be used herein to describe forming a feature, e.g. a layer "over" a side or surface, and may be used to mean that the feature, e.g. the layer may be formed "indirectly on" the implied side or surface with one or more additional layers being arranged between the implied side or surface and the formed layer.

Various embodiments provide embedded simple planar pre-produced traces which may be arranged perpendicularly beside chips. The simple planar pre-produced traces may realize vertical contacts between a top side and bottom side of a chip arrangement.

The planar technology may allow for extremely high or even highest possible line densities, at low cost. Furthermore, the eventual required height of the package, may only require an additional area, slight larger than the substrate (or wafer). As a result, there may be no limitation on the TEV height.

FIG. 2 shows a method 200 for manufacturing an embedded chip package according to an embodiment. Method 200 may include:
- forming electrically conductive lines over a substrate (in 210);
- optionally forming an electrically insulating material over substrate and at least partially surrounding each of electrically conductive lines (in 220);
- placing the substrate next to a chip arrangement including a chip, the chip including one or more contact pads, wherein one or more of electrically conductive lines may be arranged proximate to a side wall of chip (in 230); and
- forming one or more electrical interconnects over the chip arrangement to electrically connect at least one electrically conductive line to at least one contact pad (in 240).

FIGS. 3A to 3E show various illustrations for performing method 300 for manufacturing an embedded chip package according to various embodiments.

Figure 1:
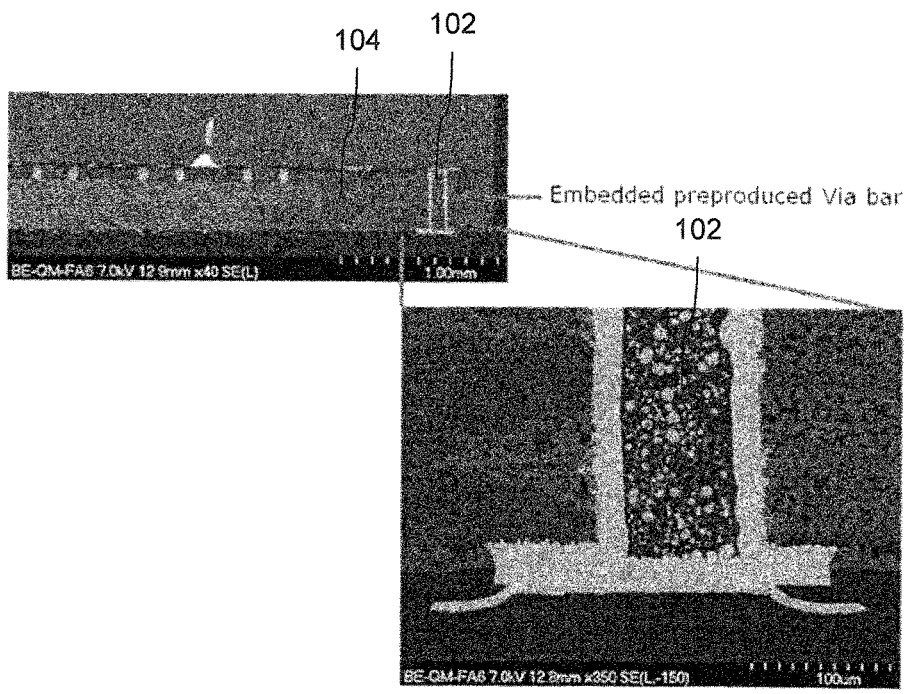
FIG. 1 shows embedded pre-produced via bars.
Figure 3A:
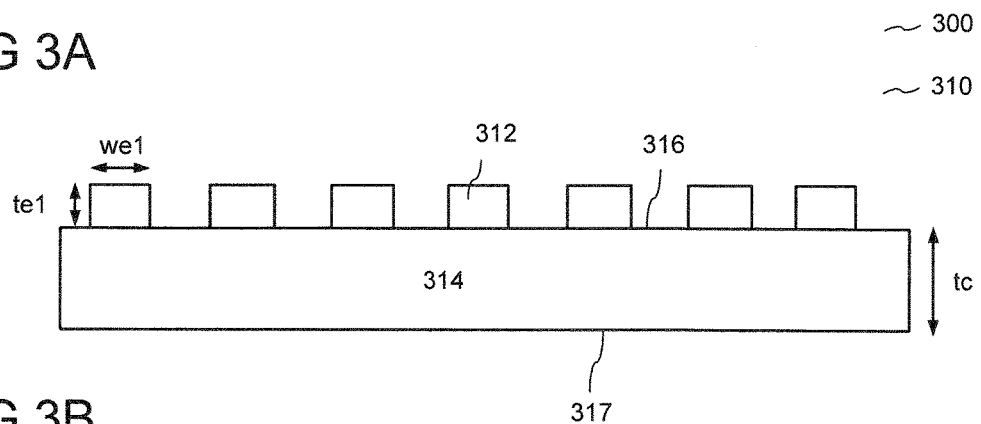
FIGS. 3A to 3E show a method for manufacturing an embedded chip package according to various embodiments.

Cross-sectional view 310 of FIG. 3A shows a substrate 314. Substrate 314 may include or be a substantially planar substrate, e.g. plate. Substrate 314 may include or be a substantially planar substrate, panel or wafer. In some embodiments, substrate 314 may include at least one material from following group of materials, group of materials consisting of: mold compound, laminate, ceramic, liquid crystal polymer and isolated metal substrates. In some embodiments, substrate 314 may include an electrically insulating material. In some embodiments, substrate 314 may include a flexible, bendible material. Substrate 314 may have a thickness of several hundred micrometers; e.g. ranging from about 200 µm to about 800 µm; e.g. from about 450 µm to about 600 µm, e.g. from about 450 µm to about 550 µm.

Substrate 314 may have a first side referred to as first substrate side 316. Substrate 314 may have a second side referred to as second substrate side 317, which may be opposite to first substrate side 316. Before depositing electrically conductive lines 312, surface treatment may be applied to first substrate side 316. For example, if needed, a thin dielectric coating (several micrometers) may be deposited over first substrate side 316. This dielectric layer, e.g. a mold compound or laminate, may be optional and may not be needed electrically. However, it may help to make the dicing process and handling processes more robust.

Subsequently, electrically conductive lines 312 may be formed over substrate 314, for example over first substrate side 316. Electrically conductive lines 312 may be produced using a semi-additive process, or by a subtractive process. Electrically conductive lines 312 may be substantially parallel to each other or may run in an angle with respect to each other. Each of electrically conductive lines 312 may include a metal. For example, each of electrically conductive lines 312 may include copper, or be formed from copper. Each electrically conductive line 312 may have a width, referred to as a first width, we1. Each electrically conductive line 312 may have a thickness, referred to as a first thickness, te1. Each electrically conductive line 312 may have a length (in direction in to page), referred to as a first length, le1.

Subsequently, if required, surface treatment may be applied to surfaces of electrically conductive lines 312 and substrate 314. This may include treatment by plasma and/or roughening and/or oxidation and/or addition of primers.

As shown in cross-sectional view 320 of FIG. 3B, subsequently, electrically insulating material 318 may be formed over substrate 314. The previous surface treatment may improve the adhesion of electrically insulating material 318 to electrically conductive lines 312 and to substrate 314. Electrically insulating material 318 may at least partially surround each of electrically conductive lines 312. For example, electrically insulating material 318 may fill gaps and/or spaces between electrically conductive lines 312. Electrically insulating material 318 may also be formed over portions of first substrate side 316, which are not covered by electrically conductive lines 312.

Electrically insulating material 318 may include a dielectric material. Electrically insulating material 318 may include at least one material from following group of materials, group of materials consisting of: mold compound, laminate, duroplast, thermoplast, and/or ceramic. Electrically insulating material 318 may be formed by compression molding. Alternatively lamination of electrically insulating material 318 may be carried out. Electrically insulating material 318 may have a thickness, tm1, ranging from about 50 µm to about several hundred micrometers; e.g. ranging from about 100 µm to about 500 µm; e.g. from about 100 µm to about 300 µm, e.g. from about 100 µm to about 200 µm. The overall thickness of electrically insulating material 318 may be greater than thickness, te1, of electrically conductive lines 312. The thickness of electrically insulating material 318 may optionally be adjusted by additional grinding.

Figure 3B:
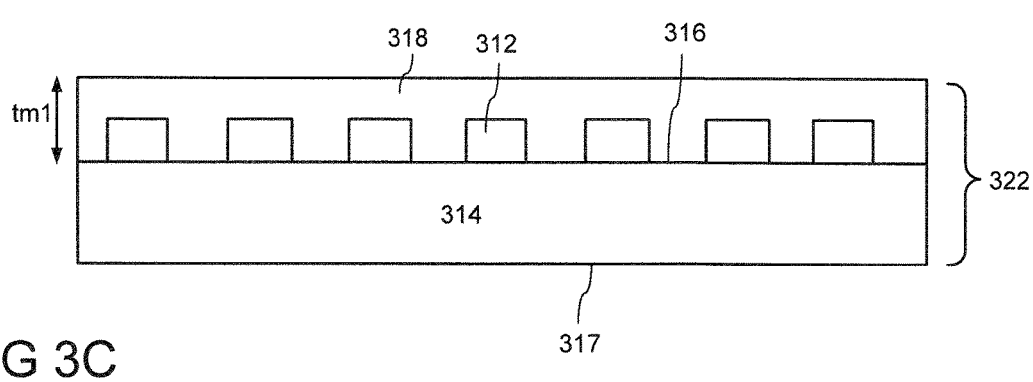

As shown in FIGS. 3A and 3B, an electrically conductive line arrangement 322, which includes electrically conductive lines 312 embedded between substrate 314 and electrically insulating material 318, may be formed using simple deposition of metallic lines. Gap filling, and other complex processes used in conventional manufacturing may be avoiding.

Figure 3C:
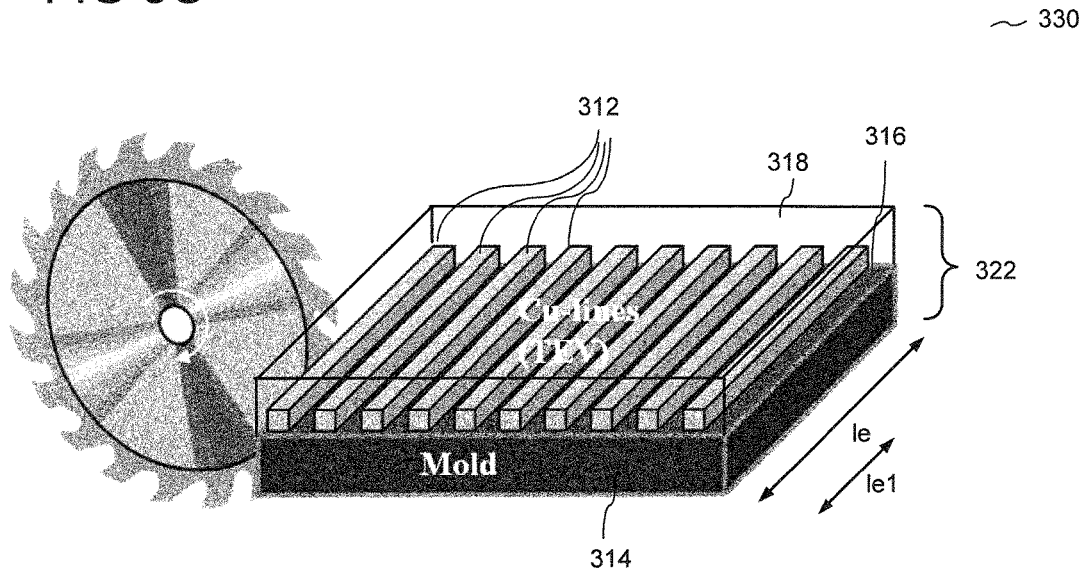

As shown in view 330 of FIG. 3C, the electrically conductive line arrangement 322 may be modified depending on its required use with a chip package.

Depending on the length required of the electrically conductive lines 312, dicing may optionally be carried out e.g. in a direction perpendicular to the length of electrically conductive lines 312, to reduce the length, le, of electrically conductive lines 312 to an eventual length le1. Dicing may optionally also be carried out in a direction parallel to the length of electrically conductive lines, e.g. through electrically insulating material 318 and substrate 314, to select the number of electrically conductive lines 312 in electrically conductive line arrangement 322. Eventual electrically conductive line arrangement 322 may include, for example, four electrically conductive lines 312, each having a length, le1, ranging from about 200 µm to about 1500 µm, e.g. from about 400 µm to about 800 µm, e.g. from about 450 µm to about 600 µm.

Figure 3D:
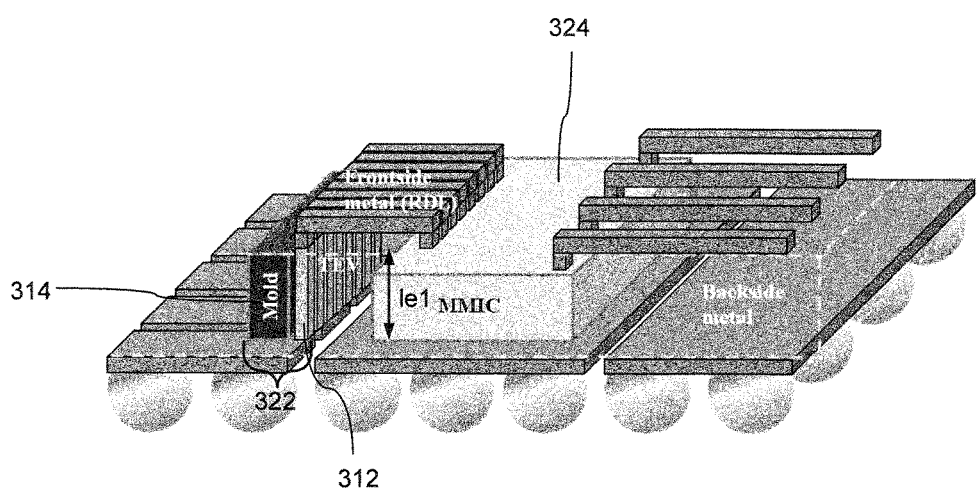
Figure 3E:
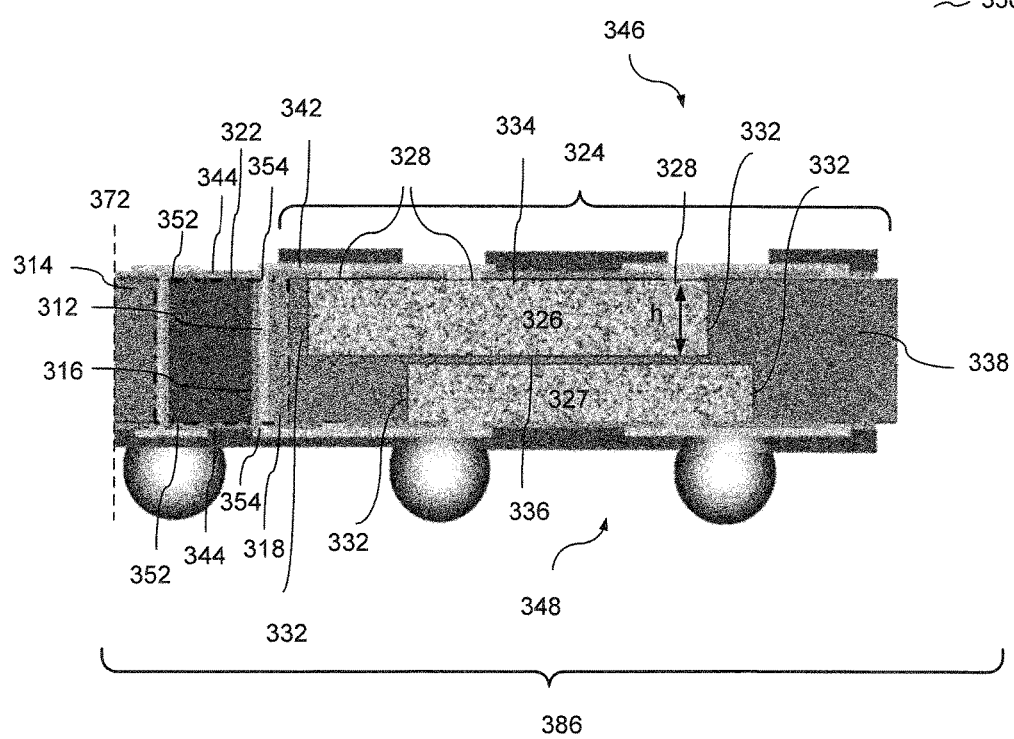
Figure 4:
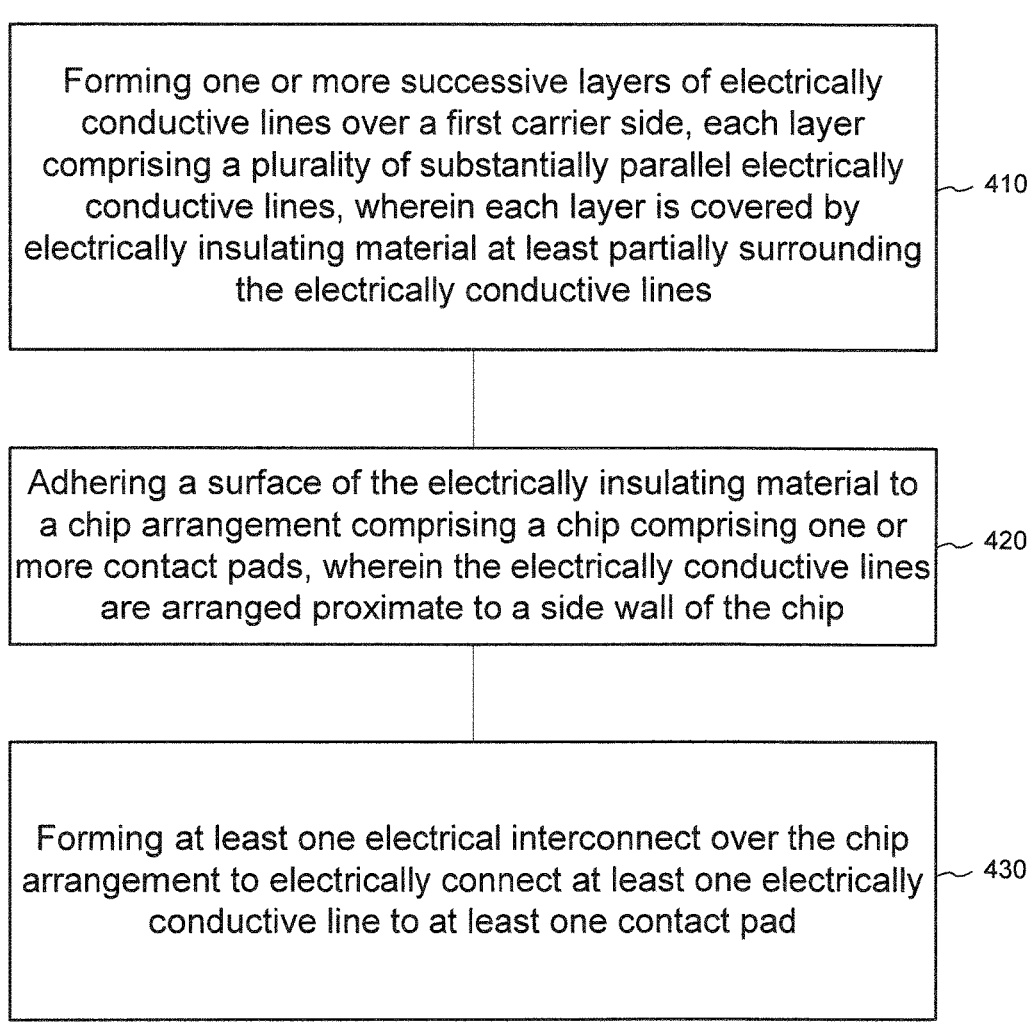
FIG. 4 shows a method for manufacturing an embedded chip package according to an embodiment.

As shown in three-dimensional view 340 of FIG. 3D, and in cross-sectional view 350 of FIG. 3E, electrically conductive line arrangement 322 may be arranged proximate to chip arrangement 324. Chip arrangement 324 may include at least one chip 326, (shown in FIG. 3E) wherein each chip 326 may include one or more contact pads 328.

Each chip may have a height, h, ranging from about 40 µm to about 800 µm, e.g. from about 100 µm to about 600 µm, e.g. from about 1500 µm to about 400 µm.

Electrically insulating material 318 may be adjoined to chip arrangement 324, wherein electrically conductive lines 312 may be arranged proximate to chip arrangement 324. Electrically conductive lines 312 may be arranged proximate to a side wall 332 of the at least one chip.

Electrically insulating material 318 may be adjoined or attached to chip arrangement 324, e.g. via mold material, e.g. via an adhesive material (not shown). Adhesive material, e.g. a glue or electrically insulating paste, may be used to join or adhere electrically insulating material 318 to chip arrangement 324.

As shown in FIGS. 3D and 3E, chip arrangement 324 may include at least one chip 326. Each chip 326 may include one or more chip side walls 332. Contact pads 328 may be formed over at least one of a chip top side 334 and a chip bottom side 336. Chip(s) 326 may be embedded by encapsulation material 338. In other words, encapsulation material 338 may at least partially surround chip 326. Encapsulation material 338 may, for example, cover chip side walls 332 and/or chip bottom side 336. For example, encapsulation material 338 may substantially fully surround the sides of chip(s) 326, except over contact pads 328, which may be free from encapsulation material 338. Encapsulation material 338 may surround chip 326.

It may be understood that according to some embodiments, chip arrangement 324 may include only one chip. According to other embodiments, chip arrangement 324 may include at least one chip and one or more other devices. For example, as shown in FIG. 3E chip arrangement 324 may include at least one chip 326 and at least one further chip 327. According to some embodiments, chip arrangement 324 may include one chip 326 and further passive and/or logic devices. For example, at least one of chip 326 and chip 327 may be replaced by passive and/or logic components.

It may be understood that electrically conductive line arrangement 322 may be joined or adhered to chip arrangement 324. For example, turned 90° and embedded so that electrically conductive lines 312 may be vertical aligned to the main surfaces of chip arrangement 324, e.g. vertically aligned to a chip side wall 332. According to some embodiments, electrically insulating material 318 may be joined or adhered to chip arrangement 324. According to other embodiments, electrically insulating material 318 may be joined or adhered to a chip side wall 332. For example, electrically insulating material 318 may be joined or adhered directly to a chip side wall 332. According to other embodiments, electrically conductive lines 312 may be joined or adhered directly onto chip arrangement 324. According to other embodiments, electrically conductive lines 312 may be joined or adhered to encapsulation material 338 which may cover or electrically insulate chip side walls 332, e.g. to a portion of encapsulation material 338 which adjacent to a chip side wall 332.

According to these above-described embodiments, adhesive material (not shown) may be used to join or adhere electrically conductive line arrangement 322 to chip arrangement 324. In these embodiments, electrically conductive lines 312 may be arranged wherein electrically conductive lines 312 may be substantially parallel to a chip side wall 332. Each of electrically conductive lines 312 may be arranged wherein each electrically conductive line 312 may be substantially equidistant from a chip side wall 332. Furthermore, electrically conductive lines 312 may be arranged in a direction extending between chip top side 334 and chip bottom side 336. As electrically conductive lines 312 may be embedded between substrate 314 and electrically insulating material 318, and may be parallel to the chip side walls 332, they may be referred to as embedded Z lines (EZL).

Subsequently, one or more electrical interconnects 342 may be formed over chip arrangement 324 to electrically connect at least one electrically conductive line 312 to at least one contact pad 328.

First, a redistribution dielectric material 344 may be formed over or directly on chip arrangement 324. Redistribution dielectric material 344 may be formed over or directly on chip arrangement top side 346. Redistribution dielectric material 344 may also be formed over or directly on chip arrangement bottom side 348. Redistribution dielectric material 344 may electrically insulate parts of the chip arrangement 324 from its surroundings, and may prevent electrical shorting. Furthermore, redistribution dielectric material 344 may also be formed over or directly on side walls 352 of electrically conductive line arrangement 322. Side walls 352 of electrically conductive line arrangement 322 may be perpendicular to substrate top side 316 and substrate bottom side 317. Furthermore side walls 352 may be the side of electrically conductive line arrangement 322 that exposes edge regions 354, e.g. the distal end portions, of electrically conductive lines 312.

One or more first through-holes may be formed through redistribution dielectric material 344 to expose contact pads 328 and edge regions 354 of electrically conductive lines 312 from redistribution dielectric material 344 at chip arrangement top and/or bottom sides 346, 348.

One or more electrical interconnects 342 may be formed by selectively depositing electrically conductive material, e.g. metal, over or directly on redistribution dielectric material 344 and in the one or more first through-holes. This may be carried out, e.g. using photolithography, or e.g. patterned plating. The one or more electrical interconnects 342 may be deposited over or directly on edge regions 354 of electrically conductive lines 312. Furthermore, the one or more electrical interconnects 342 may be deposited over or directly on contact pads 328. It may be understood, that each respective electrically conductive line 312 of the one or more electrically conductive lines may be electrically connected to a respective contact pad 328 of the one or more contact pads. Electrical interconnects 342 may be formed over chip top side 334 and/or a chip bottom side 336, depending on the way the chip(s) 326 are arranged.

In some embodiments, chip 326 may be arranged faced up, e.g. with chip top side 334 facing the same side as chip package top side 346 and chip bottom side 336 facing the same side as chip package bottom side 348. In some embodiments, chip 326 may be arranged faced down, e.g. with chip top side 334 facing the same side as chip package bottom side 348 and chip bottom side 336 facing the same side as chip package top side 346. In some embodiments (as shown in FIG. 3E), chip 326 may be arranged facing upwards; whereas chip 327 may be arranged faced down.

Dicing through substrate 314 may be carried out in a direction substantially parallel to electrically conductive lines 312 to create an individualized embedded chip package 386. As an example, dicing may be carried out along dicing lines 372.

FIGS. 4 and 5A to 5C show methods 400 and 500 for manufacturing an embedded chip package according to various embodiments. Methods 400 and 500 may include one or more or all of the features already described with respect to method 200, however, they may be modified for manufacturing multi-layers of TEVs, and for attaching the electrically conductive line arrangements to a plurality of chip arrangements.

Method 400 may include:

forming one or more successive layers of electrically conductive lines over a first substrate side, each layer including a plurality of (e.g. substantially parallel) electrically conductive lines, wherein each layer optionally may be covered by electrically insulating material at least partially surrounding electrically conductive lines (in 410);

placing the substrate next to a chip arrangement including a chip, the chip including one or more contact pads, wherein electrically conductive lines are arranged proximate to a side wall of chip (in 420); and forming at least one electrical interconnect over the chip arrangement to electrically connect at least one electrically conductive line to at least one contact pad (in 430).

Figure 5A:
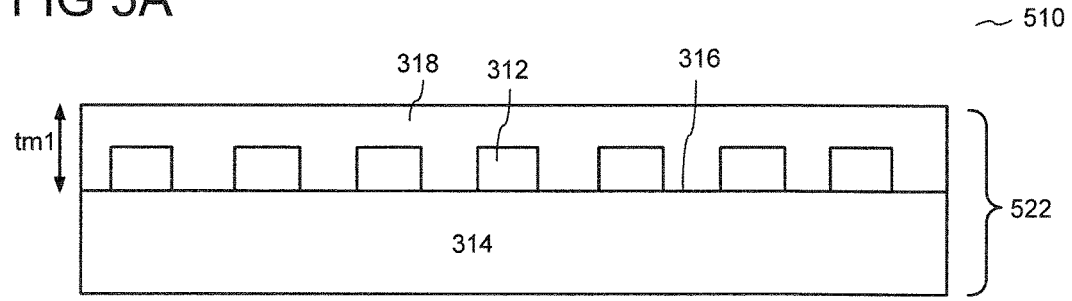
FIGS. 5A to 5C show a method for manufacturing an embedded chip package according to various embodiments.
Figure 5B:
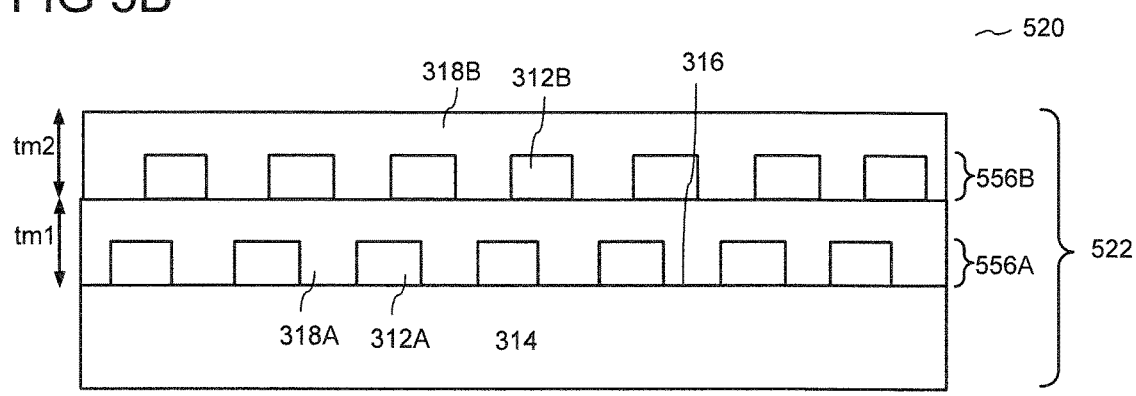
Figure 5C:
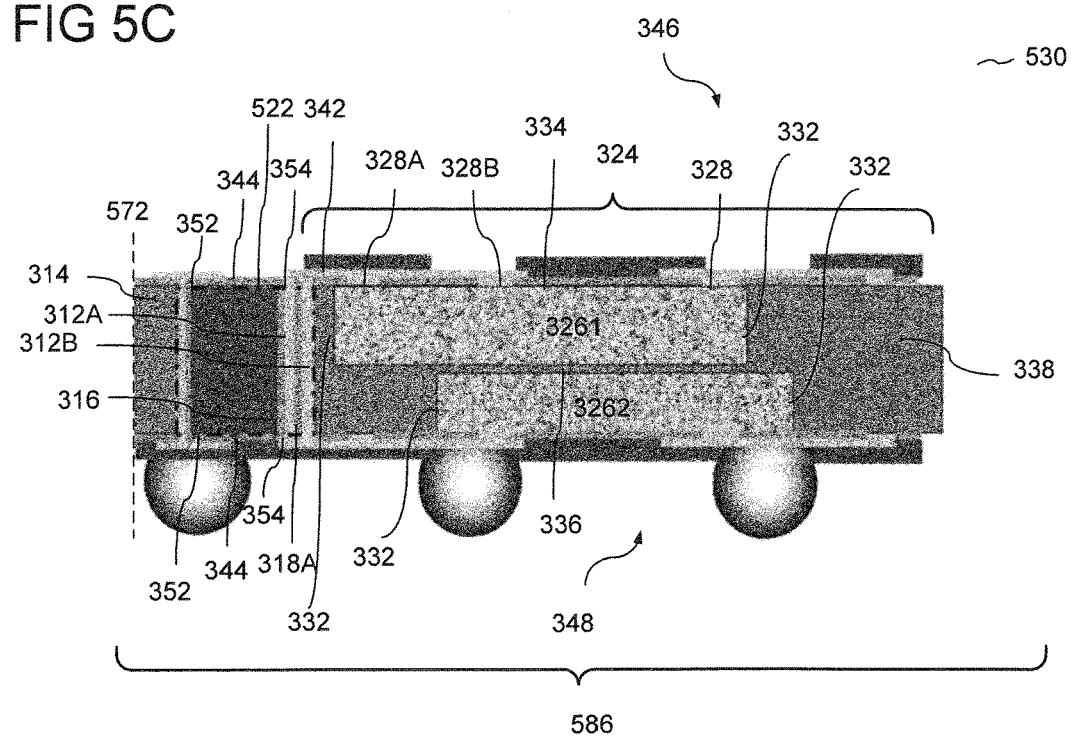

FIGS. 5A to 5C shows various illustrations for performing method 500 for manufacturing an embedded chip package according to various embodiments.

As shown in cross-sectional view 510 of FIG. 5A, similarly to the processes already described according to FIG. 3A and FIG. 3B of method 300, method 500 may include forming electrically conductive lines 312 over substrate 314, and optionally forming electrically insulating material 318 over electrically conductive lines 312.

In method 500, instead of having only one layer 556A of electrically conductive lines 312 as described in method 300, one or more successive layers 556A, 556B of electrically conductive lines 312 may be formed over first substrate side 316.

First layer 556A of electrically conductive lines 312A may be formed over substrate 314. First electrically insulating material 318A may be formed over substrate 314 and at least partially surrounding first layer 556A of electrically conductive lines 312 as described according to method 300.

If required, surface treatment as described according to method 300 may be applied to surfaces of first electrically insulating material 318A, e.g. by depositing a thin dielectric material.

Subsequently, as shown illustratively in cross-sectional view 520 of FIG. 5B, second layer 556B of electrically conductive lines 312B may be formed over first electrically insulating material 318A in processes similar to those used for forming electrically conductive lines 312A and electrically conductive lines 312 in method 300. Second electrically insulating material 318B may optionally be formed over second layer 556B of electrically conductive lines 312B in processes similar to those used for forming first electrically insulating material 318A and electrically insulating material 318 in method 300.

As a result, each layer 556A, 556B may include a plurality of substantially parallel electrically conductive lines 312, wherein each layer 556A, 556B may be covered by electrically insulating material 318 at least partially surrounding electrically conductive lines 312.

Electrically conductive lines 312B of second layer 556B may be substantially parallel to electrically conductive lines 312A of first layer 556A. This may be the only alignment condition. For example, no lateral alignment may be needed as electrically conductive lines 312B of second layer 556B and electrically conductive lines 312A of first layer 556A may be anisotropic vertical contacts. In other words, each electrically conductive line 312B of second layer 556B need not be exactly aligned to each electrically conductive line 312A of first layer 556A.

Surface treatment may optionally be applied to surfaces of electrically conductive lines 312B, which may improve the adhesion of second electrically insulating material 318B to electrically conductive lines 312B and to first electrically insulating material 318A.

First electrically insulating material 318A may have a thickness, tm1, ranging from about 50 μm to about several hundred micrometers; e.g. ranging from about 50 μm to about 500 μm; e.g. from about 50 μm to about 300 μm, e.g. from about 80 μm to about 200 μm. The overall thickness of first electrically insulating material 318A may be greater than thickness, te1, of first electrically conductive lines 312A.

Similarly, second electrically insulating material 318B may have a thickness, tm2, ranging from about 50 μm to about several hundred micrometers; e.g. ranging from about 50 μm to about 500 μm; e.g. from about 50 μm to about 300 μm, e.g. from about 80 μm to about 200 μm. The overall thickness of second electrically insulating material 318B may be greater than thickness, te2, of second electrically conductive lines 312B.

FIG. 5B shows electrically conductive line arrangement 522. Electrically conductive line arrangement 522 may include one or more successive layers, e.g. two layers 556A, 556B, of electrically conductive lines 312A, 312B, formed over first substrate side 316. Each layer 556A, 556B may include a plurality of (e.g. substantially parallel) electrically conductive lines 312, wherein each layer may be covered by electrically insulating material 318 at least partially surrounding the electrically conductive lines 312.

Similarly to method 300, depending on the length required of the layers 556A, 556B of electrically conductive lines 312A, 312B, dicing may optionally be carried out in a direction perpendicular to the length of electrically conductive lines 312, to reduce the length, le, of electrically conductive lines 312A, 312B to an eventual length le1 and/or in a direction parallel to the length of electrically conductive lines, through first and electrically insulating materials 318A, 318B and substrate 314, to select the number of electrically conductive lines 312 in electrically conductive line arrangement 522.

As shown in cross-sectional view 530 of FIG. 5C, similarly to method 300, electrically conductive line arrangement 522 may be arranged proximate to chip arrangement 324. Electrically insulating material 318B (not shown) may be adjoined to (e.g. embedded with) chip arrangement 324, wherein electrically conductive lines 312B and 312A may be arranged proximate to chip arrangement 324. Electrically conductive lines 312B may be arranged proximately to a side wall of the at least one chip.

According to some embodiments, second electrically insulating material 318B may be adjoined or adhered to, in addition or alternatively embedded with, chip arrangement 324. For example, electrically insulating material 318B may be joined or adhered to encapsulation material 338. According to other embodiments, second electrically insulating material 318B may be joined or adhered to chip side walls 332. According to other embodiments, electrically conductive lines 312B may be joined or adhered directly to chip arrangement 324. According to other embodiments, electrically conductive lines 312B may be joined or adhered to encapsulation material 338.

Electrically conductive lines 312A, 312B may be substantially parallel to chip side wall 332. Electrically conductive lines 312A, 312B may be arranged in a direction extending between chip top side 334 and chip bottom side 336. Each of electrically conductive lines 312A of first layer 556A may be substantially equidistant from a chip side wall 332. For example, each of electrically conductive lines 312A of first layer 556A may have a distance dA from chip side wall 332. Each of electrically conductive lines 312B of second layer 556B may be substantially equidistant from a chip side wall 332. For example, each of electrically conductive lines 312A of first layer 556A may be a distance dB from chip side wall 332. Distance dA may be different from distance dB. For example, distance dA may be larger than distance dB.

Similarly to method 300, subsequently, at least one electrical interconnect 342 may be formed over chip arrangement 324 to electrically connect at least one electrically conductive line 312 to at least one contact pad 328.

Dicing through substrate 314 may be carried out in a direction substantially parallel to electrically conductive lines 312 to create an individualized embedded chip package 586. As an example, dicing may be carried out along dicing lines 572.

Figure 6A:
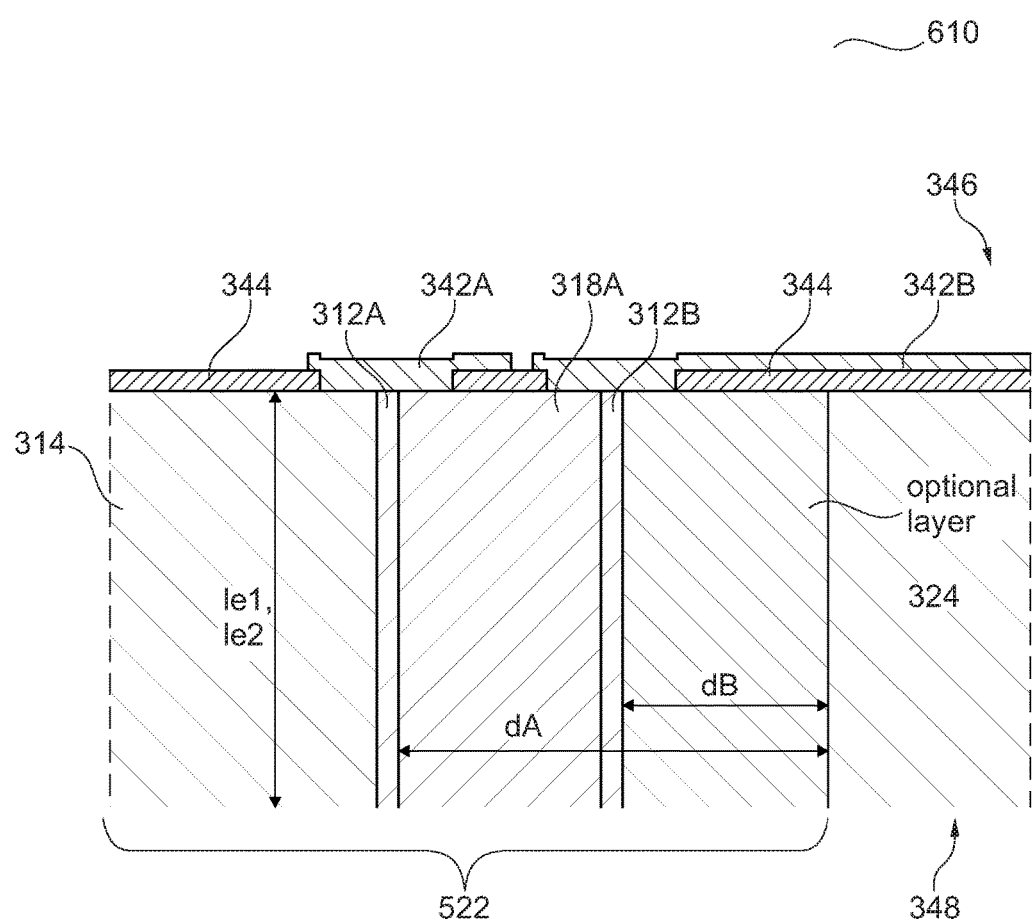
FIGS. 6A to 6C show a method for manufacturing an embedded chip package according to various embodiments.
Figure 6B:
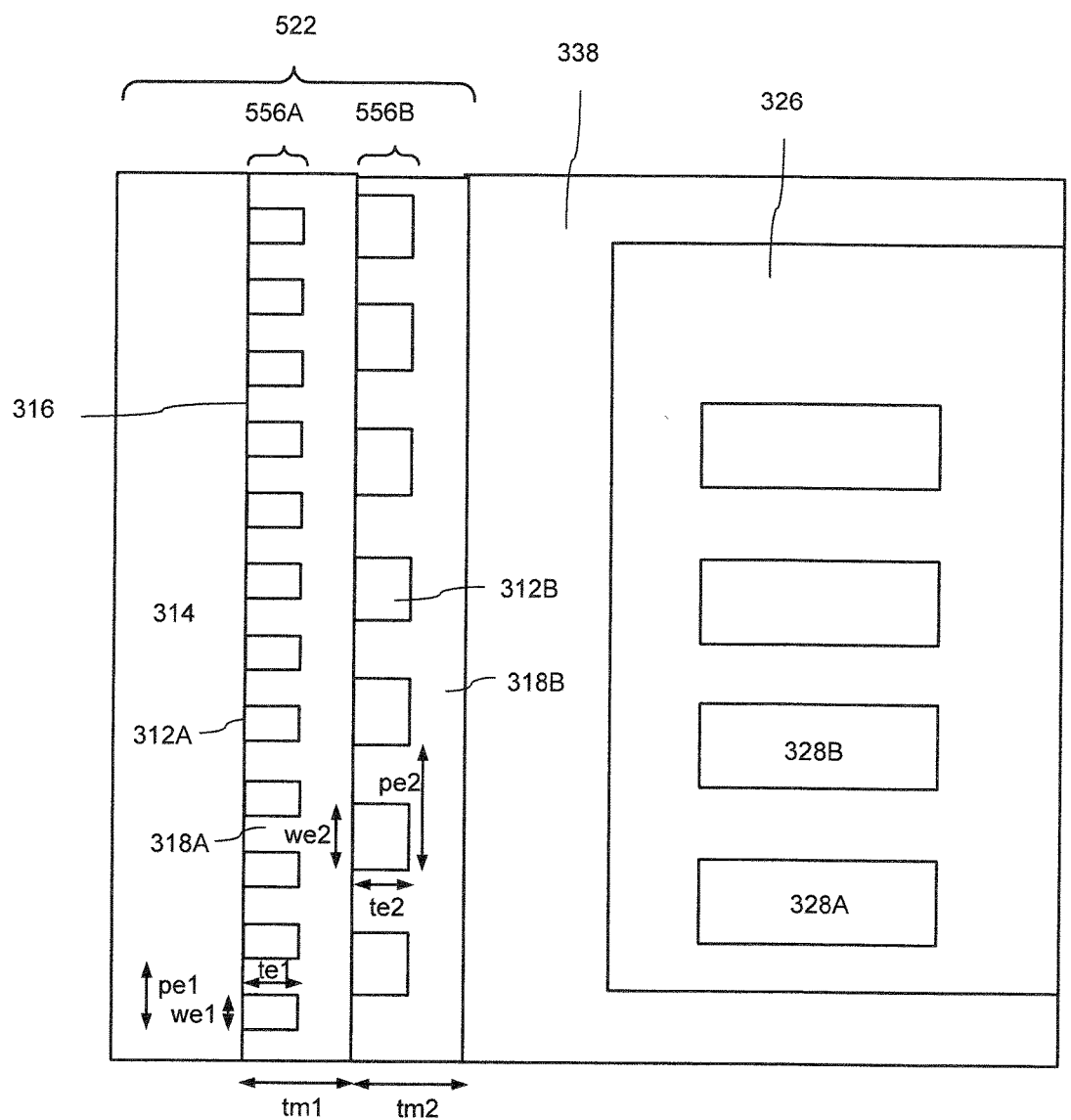
Figure 6C:
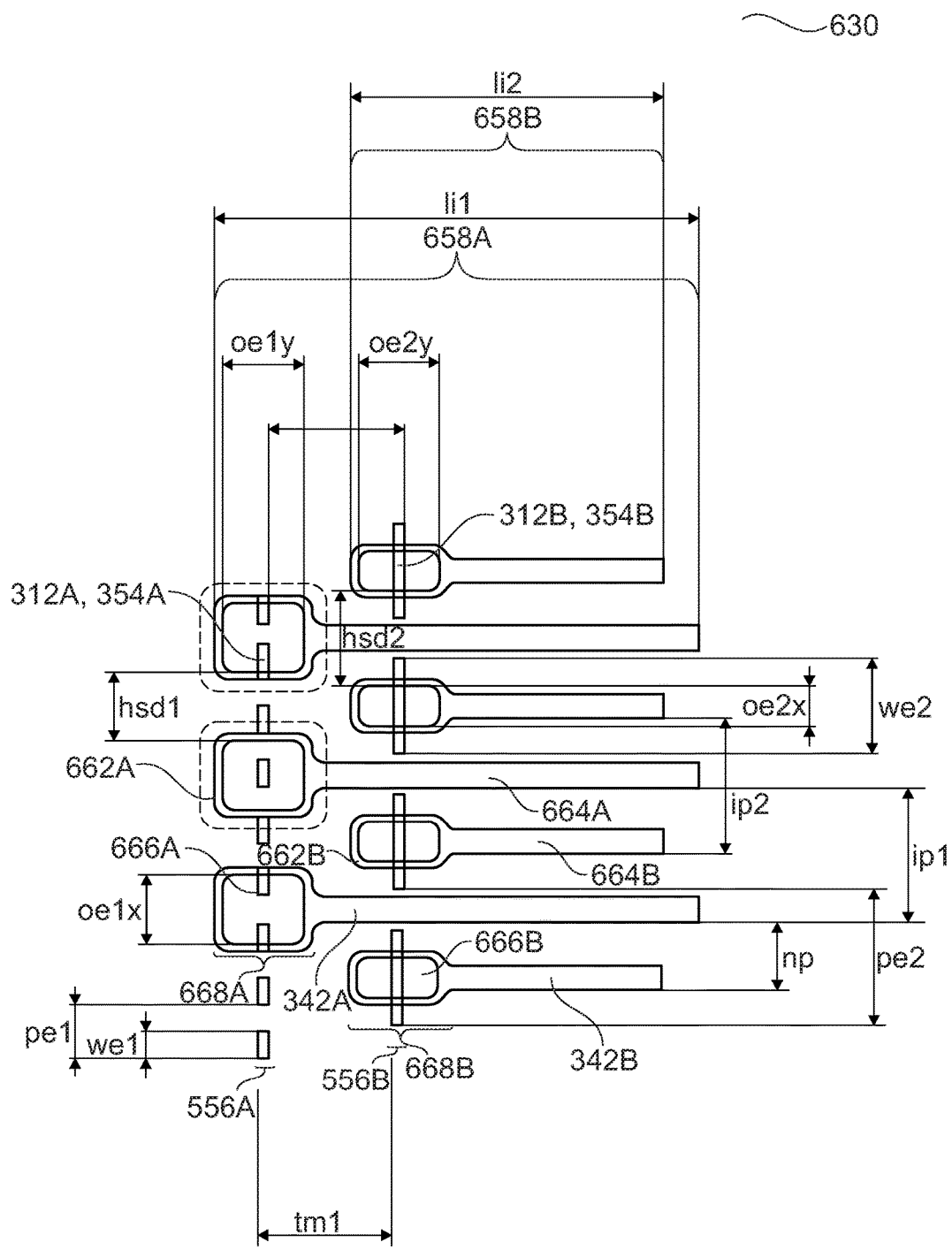

FIGS. 6A to 6C show a method for manufacturing electrically conductive line arrangement 522 and electrical interconnects 342 according to various embodiments.

FIG. 6A shows cross-sectional view 610 of how electrical interconnects 342 may be provided in the chip arrangement 324.

Redistribution dielectric material 344 may be formed over chip arrangement 324. Redistribution dielectric material 344 may be formed over chip arrangement top side 346. Redistribution dielectric material 344 may also be formed over chip arrangement bottom side 348 (not shown for simplicity). Redistribution dielectric material 344 may electrically insulate parts of the chip arrangement 324 from its surroundings, and from electrical wiring. Furthermore, redistribution dielectric material 344 may also be formed over side walls 352 of electrically conductive line arrangement 522.

One or more first through-holes (vias) may be formed through redistribution dielectric material 344 to expose at least one contact pad 328A (not shown) and edge regions 354A of first layer of electrically conductive lines 312A from redistribution dielectric material 344 at chip arrangement top and/or bottom sides 346, 348.

At least one first electrical interconnect 342A may be formed by selectively depositing electrically conductive material, e.g. metal, over or directly on redistribution dielectric material 344 and in the one or more first through-holes. The first electrical interconnect(s) 342A may be deposited over or directly on edge regions 354A of electrically conductive lines 312A. Furthermore, the first electrical interconnect(s) 342A may be deposited over or directly on contact pads 328A. It may be understood, that each respective electrically conductive line of the one or more electrically conductive lines 312A may be electrically connected to a respective contact pad 328A of the one or more contact pads 328A.

One or more second through-holes may also be formed through redistribution dielectric material 344 to expose at least one contact pad 328B (not shown) and edge regions 354B of second layer of electrically conductive lines 312B from redistribution dielectric material 344 at chip arrangement top and/or bottom sides 346, 348.

At least one second electrical interconnect 342B may be formed by selectively depositing electrically conductive material, e.g. metal, over or directly on redistribution dielectric material 344 and in the one or more second through-holes. The second electrical interconnect(s) 342B may be deposited over or directly on edge regions 354B of electrically conductive lines 312B. Furthermore, the further electrical interconnects 342(B) may be deposited over or directly on contact pads 328B. It may be understood, that each respective electrically conductive line of the one or more electrically conductive lines 312B may be electrically connected to a respective contact pad 328B of the one or more contact pads.

As shown in top view, 620 of FIG. 6B, e.g. from chip arrangement top side 346, each electrically conductive line 312A of first layer 556A may have a width, referred to as a first width, we1.

Each electrically conductive lines 312A of first layer 556A may have a thickness, referred to as a first thickness, te1. Each electrically conductive line 312A of first layer 556A may have a length (in direction in to page), referred to as a first length, le1.

Each electrically conductive line 312B of second layer 556B may have a width, referred to as a second width, we2. Each electrically conductive lines 312B of second layer 556B may have a thickness, referred to as a second thickness, te2. Each electrically conductive lines 312B of second layer 556B may have a length (in direction in to page), referred to as a second length, le2.

First length le1 may be substantially equal to second length le2.

First thickness te1 may be substantially equal to second thickness te2. First thickness te1 may range from about 3 µm to about 20 µm; e.g. from about 4 µm to about 10 µm; e.g. first thickness te1 may be about 8 µm. Similarly, second thickness te2 may range from about 3 µm to about 20 µm; e.g. from about 4 µm to about 10 µm; e.g. second thickness te1 may be about 8 µm.

First width we1 may be different from second width we2. First width we1 may range from about 10 µm to about 100 µm; e.g. from about 20 µm to about 50 µm; e.g. from about 20 µm to about 30 µm. For example, first width we1 may be about 20 µm.

Second width we2 may range from about 10 µm to about 200 µm; e.g. from about 70 µm to about 100 µm; e.g. from about 70 µm to about 80 µm. For example, second width we2 may be about 70 µm.

Each electrically conductive line 312A of first layer 556A of electrically conductive lines may be separated from a neighboring electrically conductive line of first layer 556A of electrically conductive lines by a first pitch pe1.

First pitch pe1 may range from, but is not limited to ranging from, about 50 µm to about several hundred micrometers; e.g. from about 50 µm to about 300 µm; e.g. from about 100 µm to about 200 µm; e.g. from about 100 µm to about 150 µm.

Each electrically conductive line 312B of second layer 556B of electrically conductive lines may be separated from a neighboring electrically conductive line of second layer 556B of electrically conductive lines by a second pitch pe2.

Second pitch pe2 may range from, but is not limited to ranging from, about 30 μm to about several hundred micrometers; e.g. from about 30 μm to about 200 μm; e.g. from about 100 μm to about 200 μm; e.g. from about 30 μm to about 50 μm.

First pitch pe1 and second pitch pe2 may be selected such that first pitch pe1 may be different from second pitch pe2. For example, first pitch pe1 may be less than about half of second pitch pe2. For example, first pitch pe1 may be equal to about 40 μm and second pitch pe2 may be equal to about 100 μm.

FIG. 6C in view 630 shows how electrical interconnects 342A, 342B may be formed over chip arrangement 324. One or more successive rows 658A, 658B of electrical interconnects may be formed over chip arrangement 324. Each row 658A, 658B may include a plurality of substantially parallel electrical interconnects 342. For example, first row 658A may include a plurality of (e.g. substantially parallel) first electrical interconnects 342A; and second row 658B may include a plurality of (e.g. substantially parallel) second electrical interconnects 342B. The plurality of electrical interconnects 342, e.g. first electrical interconnects 342A and first electrical interconnects 342B, may be arranged substantially perpendicular to the one or more successive layers 556A, 556B of electrically conductive lines 312. For example, the plurality of electrical interconnects 342 may be arranged, for example, over chip arrangement top side 346, whereas electrically conductive lines 312 may be arranged to extend between chip arrangement top side 346 and chip arrangement bottom side 348.

Each electrical interconnects 342A from first row 658A of electrical interconnects may electrically couple at least one electrically conductive line 312A from first layer 556A of electrically conductive lines to at least one first contact pad 328A (not shown). Each electrical interconnects 342B from a second row 658B of electrical interconnects may electrically couple at least one electrically conductive line 312B from second layer 556B of electrically conductive lines to at least one second contact pad 328B (not shown).

In order to allow each first electrical interconnects 342A to be deposited over or directly on edge regions 354A of electrically conductive lines 312A, a first row 668A of one or more first through-holes 666A also referred to as via openings, may be formed through redistribution dielectric material 344 to expose edge regions 354A of first layer 556A of electrically conductive lines 312A. Each first through-hole 666A may have breadth oe1x and length oe1y.

Breadth oe1x may be greater than or equal to first pitch pe1. For example, breadth oe1x may be greater than or equal to about 40 μm. For example, breadth oe1x may be about 50 μm. It may be understood that with the condition oe1x>=p1 that the minimal metal length contacted in an through-hole 666A is we1 and independent of the lateral via opening— 666A—position.

Length oe1y may be greater than or equal to first thickness, te1. For example, length oe1y may be greater than about 8 μm. Length oe1y may be equal to the sum of first thickness te1 and an accuracy parameter. For example, oe1y≥te1+(2×To), wherein To refers to an overlay accuracy parameter. To may be e.g. about 15 μm. Length oe1y may be equal to about 60 μm.

In order to allow each second electrical interconnects 342B to be deposited over or directly on edge regions 354B of electrically conductive lines 312B, a second row 668B of one or more second through-holes 666B may be formed through redistribution dielectric material 344 to expose edge regions 354B of second layer of electrically conductive lines 312B. Each second through-hole 666B may have breadth oe2x and length oe2y.

Breadth oe2x may be less than or equal to second width we2. For example, breadth oe2x may be less than or equal to about 70 μm. For example, breadth oe2x may be about 30 μm. In one embodiment breadth fulfills the condition oex2<=(we2−2×To) to ensure that the through-hole 666B does not protrude the conductive line 312B Length oe2y may be greater than or equal to second thickness, te2 and substantially equal to length oe1y. For example, length oe1y may be greater than about 8 μm. Length oe2y may be equal to the sum of second thickness te2 and an accuracy parameter. For example, oe2y≥te2+(2×To), wherein To refers to an overlay accuracy parameter. To may be e.g. about 15 μm. Length oe2y may be equal to about 60 μm.

Second width we2 may be greater than or larger than breadth oe2x. For example, second width we2 may be greater than or larger than the sum of breadth oe2x and an accuracy parameter. For example, we2≥oe2+(2×To), wherein To refers to an overlay accuracy parameter. To may be e.g. about 15 μm.

Each first through-hole 666A may be separated from a neighboring electrical first through-hole 666A in first row 668A by a minimum hole separation distance hsd1, which may prevent horizontal electrical shorting.

Separation distance hsd1 may be greater than or equal to first width we1 and a shorting parameter So. For example, hsd 1≥we1+So. So may be e.g. about 10 μm. Hsd1 may be about 30 μm.

Each electrical interconnects 342A from first row 658A of electrical interconnects may be separated from a neighboring electrical interconnects 342A from first row 658A of electrical interconnects by first interconnect pitch, ip1. First interconnect pitch ip1 may be a distance between an edge of electrical interconnects 342A and a respective same edge of a neighboring adjacent electrical interconnects 342A.

Each electrical interconnects 342B from second row 658B of electrical interconnects may be separated from a neighboring electrical interconnects 342B from second row 658B of electrical interconnects by a second interconnect pitch ip2. Second interconnect pitch ip2 may be a distance between an edge of electrical interconnects 342B and a respective same edge of a neighboring adjacent electrical interconnects 342B.

First interconnect pitch ip1 may be approximately equal to second interconnect pitch ip2. For example, first interconnect pitch ip1 may be equal to about 100 μm and second interconnect pitch ip2 may be equal to about 100 μm. It may be provided that an electrical interconnect 342B is centered between two adjacent electrical interconnects 342A. It is advantageous that an electrical interconnect 342A is centered between two adjacent electrical interconnects 342B Each electrical interconnects 342 of the one or more successive rows 658A, 658B of electrical interconnects may include first contacting portion 662 and second contacting portion 664. First contacting portion 662 may be a portion of each electrical interconnects 342 which may be formed over or directly on edge region 354 of an electrically conductive line 312. Second contacting portion 664 may be a portion of each electrical interconnects 342 which may connect first contacting portion 662 to contact pad 328.

As an example, each first electrical interconnects 342A from first row 658A of electrical interconnects may include first contacting portion 662A and second contacting portion 664A. First contacting portion 662A may be a portion of first electrical interconnects 342A which may be formed over or directly on edge region 354 of first electrically conductive line 312A. Second contacting portion 664A may be a portion of each first electrical interconnects 342A which may connect first contacting portion 662A to contact pad 328A. Furthermore, each second electrical interconnects 342B from second row 658B of electrical interconnects may include first contacting portion 662B and second contacting portion 664A. First contacting portion 662B may be a portion of second electrical interconnects 342B which may be formed over or directly on edge region 354 of second electrically conductive line 312B. Second contacting portion 664A may be a portion of each second electrical interconnects 342B which may connect first contacting portion 662B to contact pad 328B.

Neighboring pitch, np, may be a pitch distance between an electrical interconnects 342A from first row 658A of electrical interconnects and a neighboring electrical interconnects 342B from second row 658B of electrical interconnects. For example, neighboring pitch np1 may be a distance between an edge of electrical interconnects 342B and a respective same edge of a neighboring electrical interconnects 342A.

Neighboring pitch np may be approximately equal to about half of second pitch pe2. For example, neighboring pitch np may be equal to about 50 μm and second pitch pe2 may be equal to about 100 μm.

For safe conditions, i.e. in order to prevent shorting, certain conditions may be used to determine first interconnect pitch ip1. A first condition may be:

$$ip1(min)=hsd1(min)+oe1x(min);$$

wherein ip1(min)=minimum first interconnect pitch; hsd1(min)=minimum hole separation distance; and oe1x(min)=minimum breadth.

A second condition may be:

$$ip1(min)=hsd1(min)+oe1x(min)=we1(max)+So(min)+oe1x(max);$$

wherein we1(max)=maximum first width; So(min)=minimum shorting parameter; and oe1x(max)=maximum breadth oe1x.

A third condition may be:

$$ip1(min)=(we1(nom)+we1(tol)+So(min))+(oe1x(nom)+oe1x(tol));$$

wherein we1(nom)+nominal first width; we1(to1)=tolerance of first width; oe1x(nom)=nominal breadth oe1x; and oe1x(tol)=tolerance breadth oe1x.

As an example, we1(nom)=20 μm; we1(tol)=3 μm; +So(min)=10 μm; oe1x(nom)=50 μm; and oe1x(tol)=3 μm. Therefore, ip1(min)=86 μm.

In other words, ip1(min) may be at least 86 μm. For example, ip1(min) may be chosen to be about 100 μm to be sure to prevent shorting.

Similar principles and conditions may be applied to determine second interconnect pitch ip2.

According to the design principles described according to FIGS. 6A to 6C, the electrically conductive lines 312, in particular first layer 556A of electrically conductive lines 312A may be arranged such that electrical interconnects 342 need not be directly or exactly aligned to each respective electrically conductive line 312.

In fact, widths we1 and we2, and pitches pe1 and pe2 of electrically conductive lines 312 may be dimensioned in such a way, that adjacent or neighboring electrically conductive lines 312 may not be shortened even at maximal allowed lateral offset of electrical interconnects 342. Vertical electrical contacts between chip arrangement top side 346 to chip arrangement bottom side 348, may still be ensured.

According to an embodiment, a summary of the design parameters may be as follows:
te1=8 μm; te2=8 μm;
tm1=100 μm; tm2=100 μm;
we1=20 μm; we2=70 μm;
pe1=40 μm; pe2=100 μm;
oe1x=50 μm; oe1y=60 μm;
oe2x=30 μm; oe2y=60 μm;
hsd1=30 μm;
ip1=100 μm; ip2=100 μm;
np=50 μm.

According to various embodiments, each of the design parameters may be scaled up or scaled down proportionally e.g. each multiplied by the same scaling factor, to smaller or bigger dimensions.

FIGS. 7A and 7B, in views 710 and 720, show an ideal overlay of electrical interconnects 342 over edge regions 344 of electrically conductive lines 312. In an ideal overlay, first contacting portion 662A of electrical interconnect 342A may cover substantially 100% of the through-holes 666A over which first contacting portion 662A is formed. First contacting portion 662A of one electrical interconnects 342 may cover substantially 100% of at least one first through-hole 666A, for example, one first through-hole 666A and exposed edge portion 344A of electrically conductive line 312A. In this case, a total area of 40 μm×8 μm may be covered. A first contacting portion 662A1 of another electrical interconnects 342 may cover substantially 100% of two conductive lines 312A.

Figure 7C:
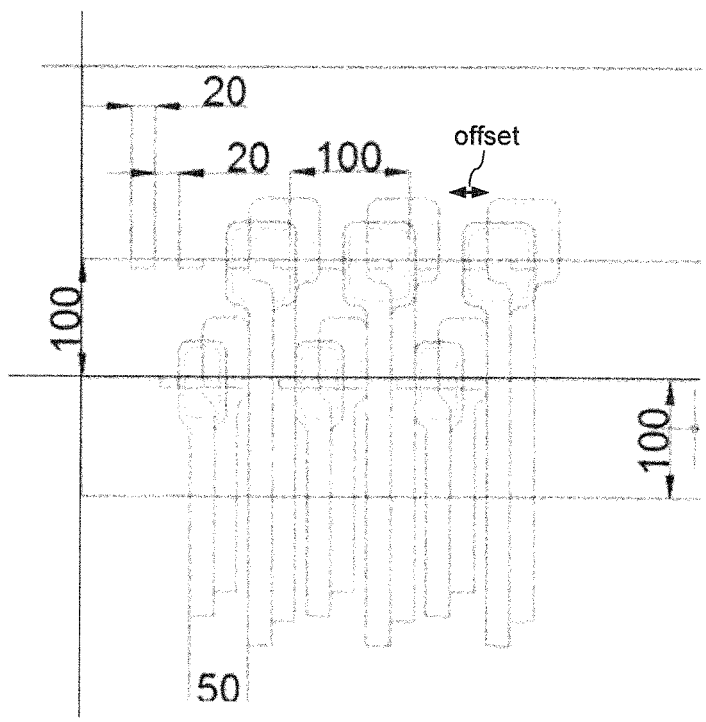
Figure 7D:
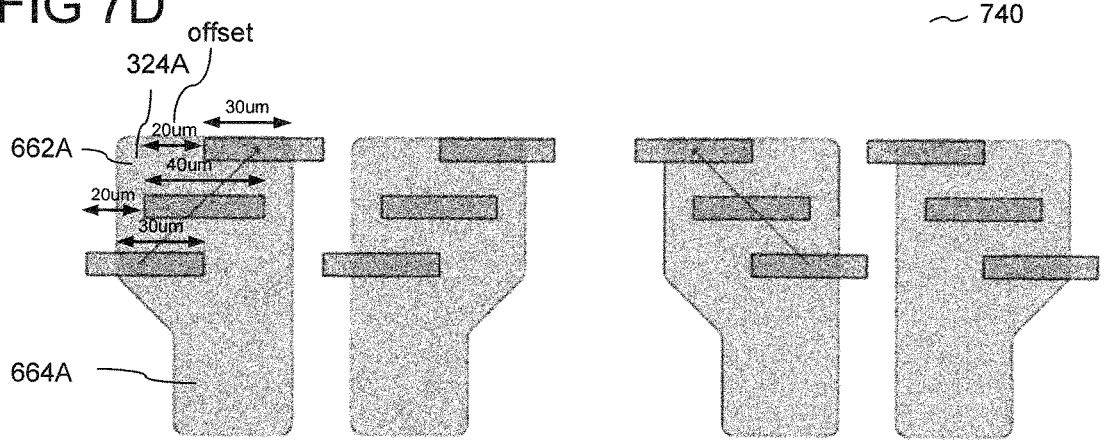

FIGS. 7C and 7D, in views 730 and 740, show an overlay of electrical interconnects 342 over edge regions 344 of electrically conductive lines 312 with a lateral offset (labeled "offset") of approximately +/−20 μm. Even in this case at a tolerance sweep of up to 20 μm, substantial coverage of one first through-hole 666A by first contacting portion 662A is obtained. For example a total area of 30 μm×8 μm may be covered.

Various embodiments therefore show that with one or more, e.g. two layers 556A, 556B of electrically conductive lines 312A, 312B, a high density pitch is possible. Each of the layers 556A, 556B need not and/or must not be aligned to each other. In other words, electrically conductive lines 312A of layer 556A need not and/or must not be aligned to electrically conductive lines 312B of layers 556B.

FIGS. 8A and 8B show a method for manufacturing an embedded chip package according to various embodiments.

FIG. 8A shows a top view 810 of an electrically conductive line arrangement 822. Electrically conductive line arrangement 822 may include one or more or all of the features already described with respect to electrically conductive line arrangement 322 and electrically conductive line arrangement 522. In addition, a mirror-image symmetrical arrangement of electrically conductive line arrangement 322 or electrically conductive line arrangement 522 over first substrate side 316, may also be formed over second substrate side 317.

In other words, one or more further successive layers 556C, 556D of further electrically conductive lines 312C, 312D may be formed over second substrate side 317.

It may be understood that processes for forming further successive layer 556C of further electrically conductive lines 312C may be analogous to those used for forming layer 556A of electrically conductive lines 312A. Substantially identical lay out conditions may be used for forming further successive layer 556C as with layer 556A. Furthermore, that processes for forming further successive layer 556D of further electrically conductive lines 312D may be analogous to those used for forming layer 556B of electrically conductive lines 312B. Substantially identical lay out conditions may be used for forming further successive layer 556D as with layer 556B.

In other words, electrically conductive lines 312A of layer 556A may be aligned to electrically conductive lines 312C of layers 556C. Furthermore, electrically conductive lines 312B of layer 556B may be aligned to electrically conductive lines 312D of layer 556D.

Each further layer 556C, 556D may include plurality of substantially parallel further electrically conductive lines 312C, 312D, wherein each further layer 556C, 556D may be covered by further electrically insulating material 318C, 318D at least partially surrounding further electrically conductive lines 312C, 312D.

As shown in cross-sectional view 820 of FIG. 8B, one portion of electrically conductive line arrangement 822 may be joined or adhered to first chip arrangement 3241 as described with respect to methods 300 to 500. Another portion of electrically conductive line arrangement 822 may be joined or adhered to second chip arrangement 3242 using a similar process.

A surface of further electrically insulating material 318D may be adhered to further chip arrangement 3242. Further chip arrangement, may include further chip 626 which may include one or more further contact pads 628 (not shown). Further electrically conductive lines 312C, 312D may be arranged proximate to a side wall of further chip 626. Further electrical interconnects 342C, 342D may be arranged over further chip arrangement 3242 to electrically connect at least one further electrically conductive line 312C, 312D to at least one further contact pad 628.

It may be understood that although electrically conductive line arrangement 822 shows two layers 556A, 556B of electrically conductive lines formed over first substrate side 316 and two layers 556C, 556D of electrically conductive lines formed over second substrate side 317, according to some embodiments only one layer may be formed over each side. It may also be understood, that according to other embodiments, more than two layers may be formed over each side.

According to various embodiments, only one electrically conductive line arrangement 822 need be used for two or more chip arrangements 3241, 3242. It may be understood that chip arrangement 3242 may be rotated 180° about an axis extending between chip arrangement top side 346 to chip arrangement bottom side 348. Subsequently, dicing through substrate 314 may be carried out in a direction substantially parallel to electrically conductive lines 312 to create an individualized embedded chip package such as embedded chip package 386 or 586. As an example, dicing may be carried out along dicing lines 872. The dicing kerf regions between the dicing lines may be discarded.

FIGS. 9 to 13 show a method for manufacturing an embedded chip package according to various embodiments.

Figure 9:
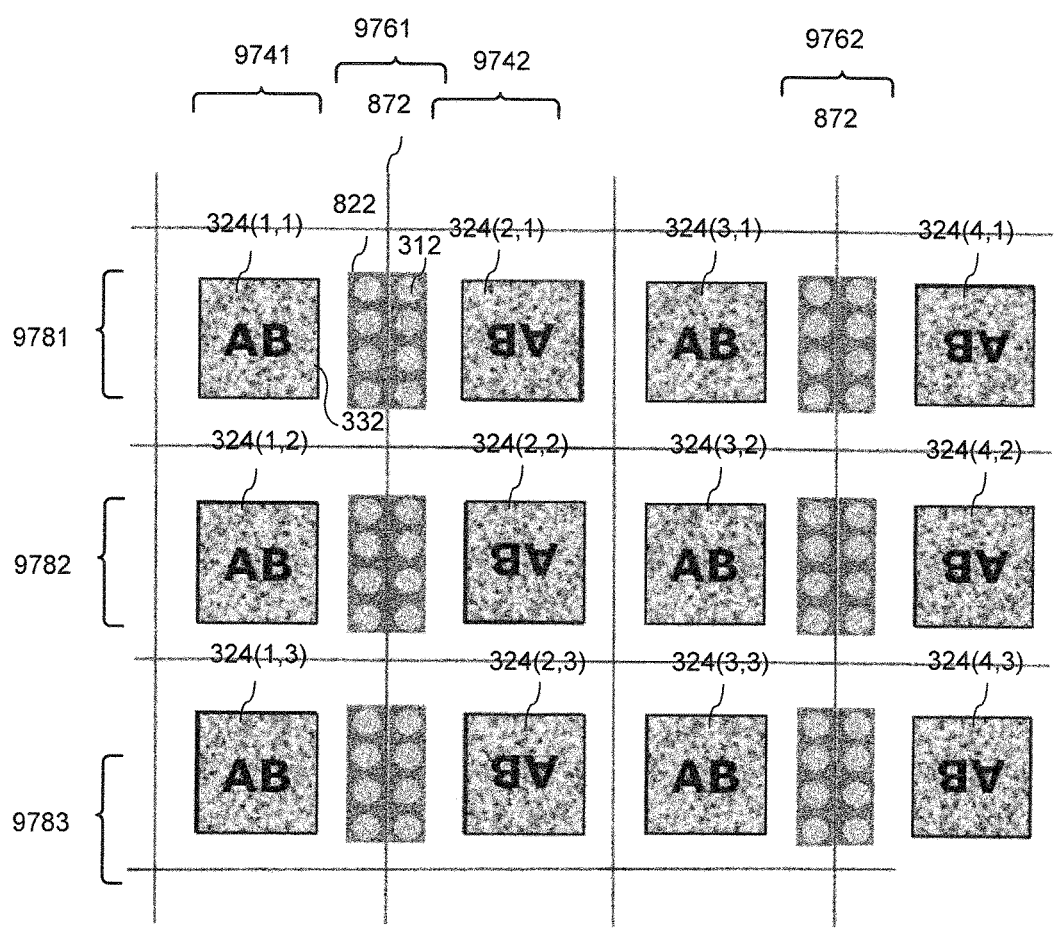
FIG. 9 shows a method for manufacturing an embedded chip package according to various embodiments.

Top view 910 of FIG. 9 shows how electrically conductive line arrangements 322, 522 or 822 may be arranged with respect to an array of chip arrangements. FIG. 9 shows an n×m array of chip arrangements 324(n,m) wherein n, m may each be an arbitrary integer number. As shown in view 910, first row 9781 may include chip arrangements 324(1,1), 324(2,1) . . . 324(n,1). Second row 9782 may include chip arrangements 324(1,2), 324(2,2) . . . 324(n,2). Third row 9783 may include chip arrangements 324(1,3), 324(2,3) . . . 324(n,3); and so forth. Similarly, first column 9741 may include chip arrangements 324(1,1), 324(1,2) . . . 324(1,m). Second column 9742 may include chip arrangements 324(2,1), 324(2,2) . . . 324(2,m). Third column 9743 may include chip arrangements 324(3,1), 324(3,2) . . . 324(3,m); and so forth.

A column 976x, e.g. 9761, 9762, . . . 976n of one or more of electrically conductive line arrangements 822 may be arranged adjacent every alternate column 974n of chip arrangements. For example, a column 9761 of one or more of electrically conductive line arrangements 822 may be arranged between first column 9741 of first chip arrangements 324(1,m) and second column 9742 of second chip arrangements 324(2,m). A further column 9762 of one or more of electrically conductive line arrangements 822 may be arranged between third column 9743 and fourth column 9744; and not between second column 9742 and third column 9743.

Each electrically conductive line arrangement 822 may include a plurality of electrically conductive lines 312, as described previously.

Electrically conductive line arrangements 822 may be adhered to the respective chip arrangements. For example, electrically conductive lines 312 may be arranged wherein electrically conductive lines 312 may be substantially parallel to chip side wall 332. Each of electrically conductive lines 312 may be arranged wherein each electrically conductive line 312 may be substantially equidistant from a chip side wall 332. Furthermore, electrically conductive lines 312 may be arranged in a direction extending between chip top side 334 and chip bottom side 336, e.g. between chip arrangement top side 346 to chip arrangement bottom side 348.

The chip arrangements in second column 9742 may each be rotated by about 180° (clockwise or anticlockwise) about an axis extending between chip arrangement top side 346 to chip arrangement bottom side 348 (as indicated by the unrotated symbol "AB", and the symbol "AB" rotated by 180°).

Similarly, the chip arrangements in fourth column 9744 may each be rotated by about 180° (clockwise or anticlockwise) about an axis extending between chip arrangement top side 346 to chip arrangement bottom side 348.

Dicing, i.e. separation of individual chip packages, may be carried out by separating through dicing lines 872, e.g. beside and/or between the electrically conductive lines 312.

Figure 10A:
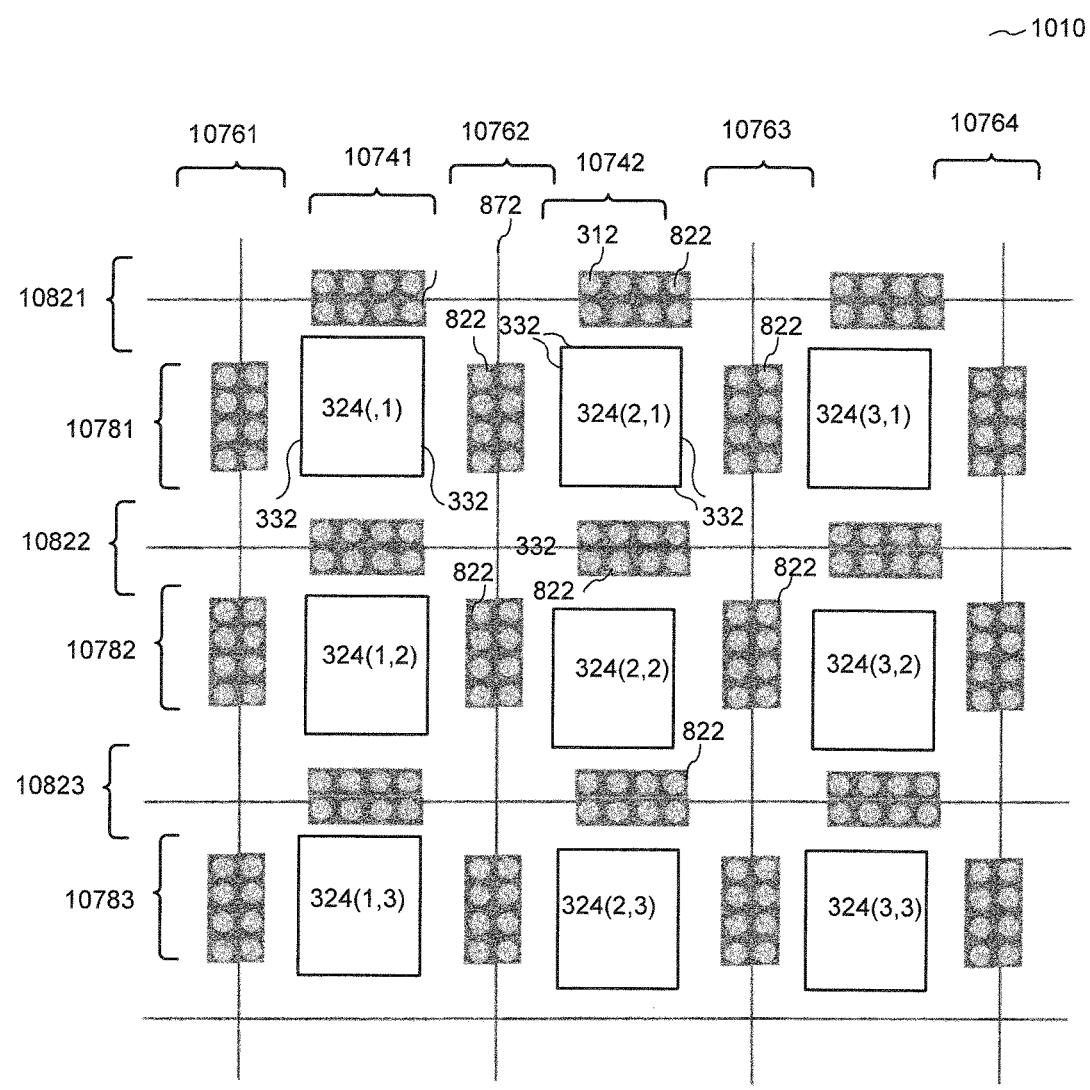
FIGS. 10A to 10C show a method for manufacturing an embedded chip package according to various embodiments.

Top view 1010 of FIG. 10A, shows an n×m array of chip arrangements 324(n,m) wherein n, m may each be an arbitrary integer number. As shown in view 1010, first row 10781 may include chip arrangements 324(1,1), 324(2,1) . . . 324(n,1). Second row 10782 may include chip arrangements 324(1,2), 324(2,2) . . . 324(n,2). Third row 10783 may include chip arrangements 324(1,3), 324(2,3) . . . 324(n,3); and so forth.

Similarly, first column 10741 may include chip arrangements 324(1,1), 324(1,2) . . . 324(1,m). Second column 10742 may include chip arrangements 324(2,1), 324(2,2) . . . 324(2,m). Third column 10743 may include chip arrangements 324(3,1), 324(3,2) . . . 324(3,m); and so forth.

A column 1076, e.g. 10761, 10762, . . . 1076n, of one or more of electrically conductive line arrangements 822 may be arranged adjacent each column 1074i of chip arrangements. Similarly, a row 1082, e.g. 10821, 10822, . . . 1082m, of one or more of electrically conductive line arrangements 822 may be arranged adjacent each row 1078m of chip arrangements.

Neighboring chip arrangements from neighboring rows may each share an electrically conductive line arrangement. Furthermore, neighboring chip arrangements within a row may also share an electrically conductive line arrangement. For example, a chip arrangement 324(2,1) in row 10781 may be adhered to a first side of electrically conductive line arrangement 822A, e.g. over first substrate side 316. A chip arrangement 324 (2,2) in row 10782 may be adhered to a second side of electrically conductive line arrangement 822, e.g. over second substrate side 317. Each chip arrangement may be surrounded by four electrically conductive line arrangements 822. That is, at least one electrically conductive line arrangement 822 may be adhered or arranged proximate to each side wall 332. Each electrically conductive line arrangement 822 may be shared with a neighboring chip arrangement, e.g. between two neighboring chip arrangements.

Dicing may be carried out by separating along dicing lines 872 through electrically conductive line arrangement 822, e.g. through substrate 314, thereby separating the electrically conductive lines into separate embedded chip packages. Separating through dicing lines 872 may occasionally require dicing through PCB material and/or mixed materials. It may be understood that the electrically conductive line arrangement 822 in rows 1082$i$ are not necessarily identical with the electrically conductive line arrangement 822 in columns 1076$j$. It may be understood that the electrically conductive line arrangements 822 are not necessarily symmetrically designed.

Figure 10B:
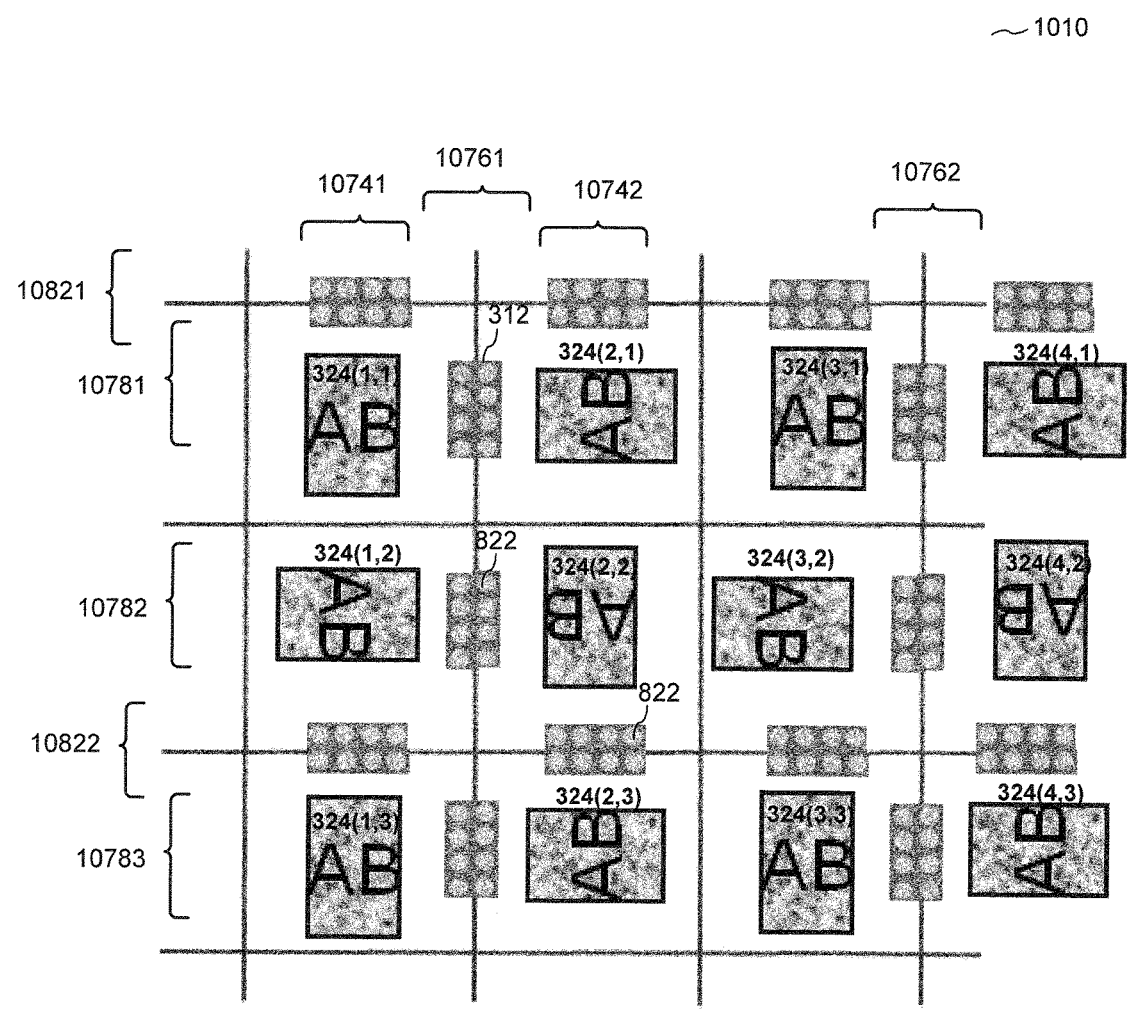

Top view 1020 of FIG. 10B shows another embodiment. In this embodiment, each chip arrangement may be surrounded by two electrically conductive line arrangements 822. That is, one or more side walls of the chip may be free from an electrically conductive line arrangement 822. Each electrically conductive line arrangement 822 may be shared with a neighboring chip arrangement, e.g. between two neighboring chip arrangements.

A column 1076, e.g. 10761, 10762, . . . 1076$n$, of one or more of electrically conductive line arrangements 822 may be arranged adjacent every alternate column 1074 of chip arrangements, i.e. adjacent every other column 1074. Similarly, a row 1082, e.g. 10821, 10822, . . . 1082$m$, of one or more of electrically conductive line arrangements 822 may be arranged adjacent every alternate row 1078 of chip arrangements, i.e. adjacent every other row 1078.

It may be understood that each of the chip arrangements may be aligned by 90° rotations as indicated by the letters AB. It may be understood that the chip arrangement may be repeated every second row 1078$i$ and second column 1074$j$.

Dicing may be carried out by separating along dicing lines 872 through electrically conductive line arrangement 822, e.g. through substrate 314, thereby separating the electrically conductive lines into separate embedded chip packages.

Figure 10C:
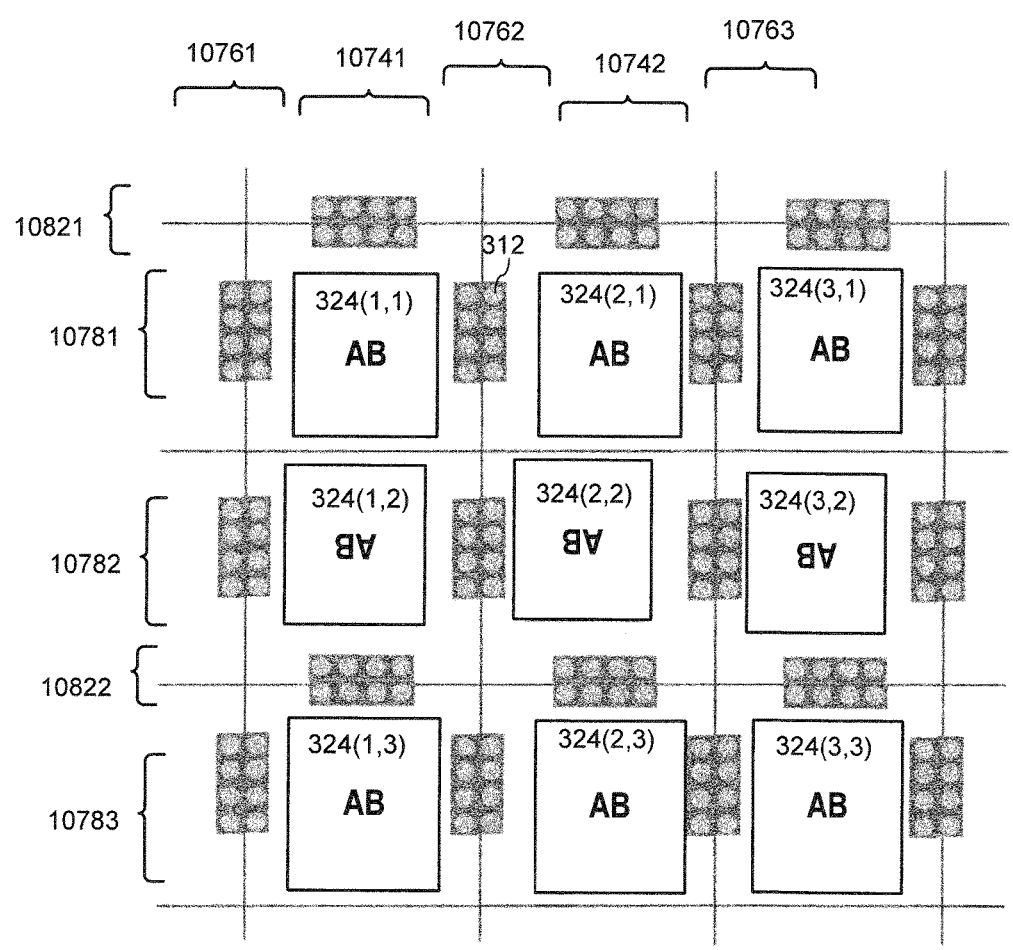

Top view 1030 of FIG. 10C shows another embodiment. In this embodiment, each chip arrangement may be surrounded by three electrically conductive line arrangements 822. That is, one or more side walls of the chip may be free from an electrically conductive line arrangement 822. Each electrically conductive line arrangement 822 may be shared with a neighboring chip arrangement, e.g. between two neighboring chip arrangements.

A column 1076, e.g. 10761, 10762, . . . 1076$n$, of one or more of electrically conductive line arrangements 822 may be arranged adjacent every column 1074 of chip arrangements. On the other hand, a row 1082, e.g. 10821, 10822, . . . 1082$m$, of one or more of electrically conductive line arrangements 822 may be arranged adjacent every alternate row 1078$x$ of chip arrangements.

It may be understood that each of the chip arrangements in second row 1078$x$ may each be rotated by about 180° (clockwise or anticlockwise) about an axis extending between chip arrangement top side 346 to chip arrangement bottom side 348.

Dicing may be carried out by separating along dicing lines 872 through electrically conductive line arrangement 822, e.g. through substrate 314, thereby separating the electrically conductive lines into separate embedded chip packages.

The methods for manufacturing an embedded chip package described according to FIGS. 9 and 10A to 10C address many complexities relating to cost, size and space consumption of TEVs. By way of example, the arrangement of electrically conductive line arrangements 312, 322 or 822 with respect to an array of chip arrangements ensure that the electrically conductive lines functioning as TEVs in a chip package, may be encapsulated, e.g. in electrically insulating material. As a result, corrosion and/or electrical shorting may be prevented. Furthermore, The arrangements may lead to a reduction in the number of pick and place (P&P) elements, e.g. in this case up to a 50% reduction in P&P elements. Furthermore, the P&P process may be simpler due to the ratio of length to width and area to height.

Figure 11A:
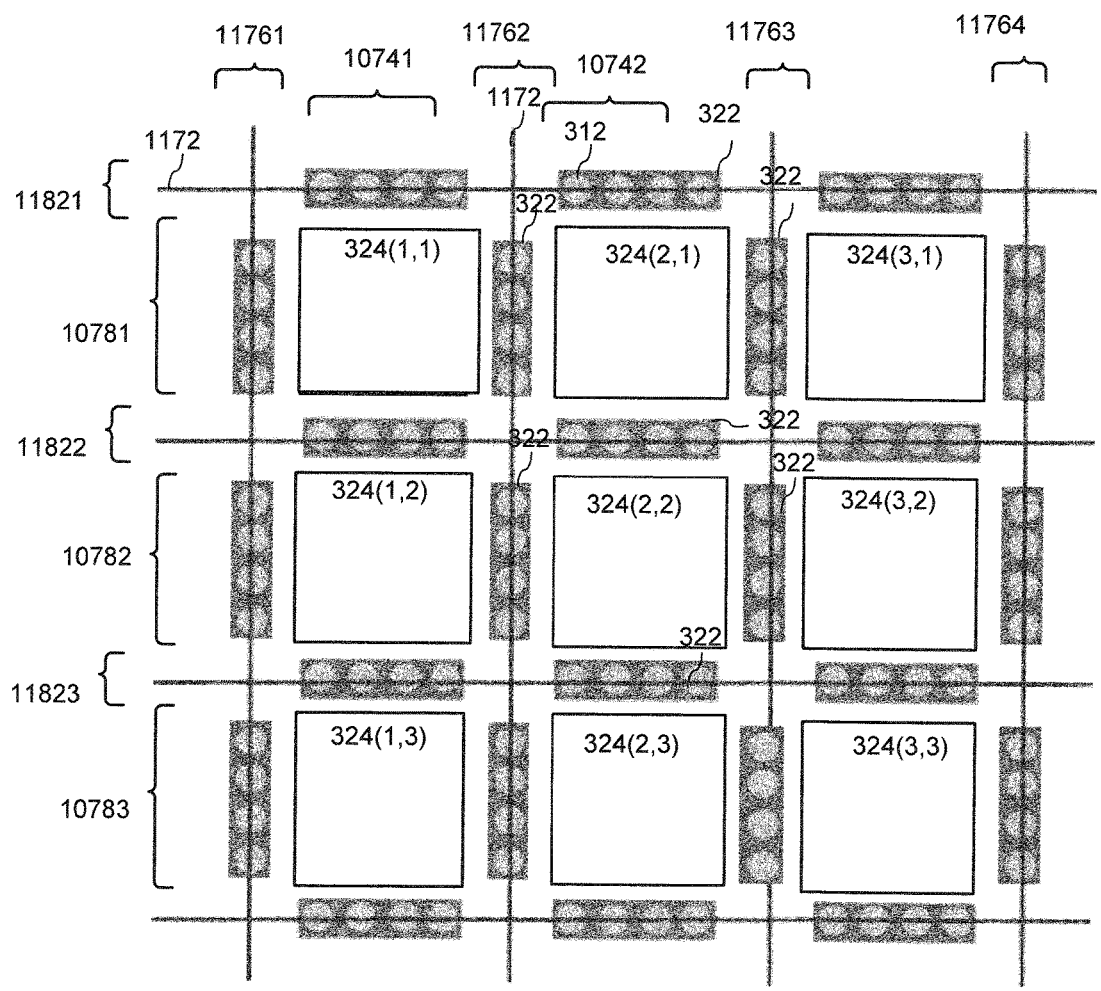
FIGS. 11A to 11C show a method for manufacturing an embedded chip package according to various embodiments.
Figure 11B:
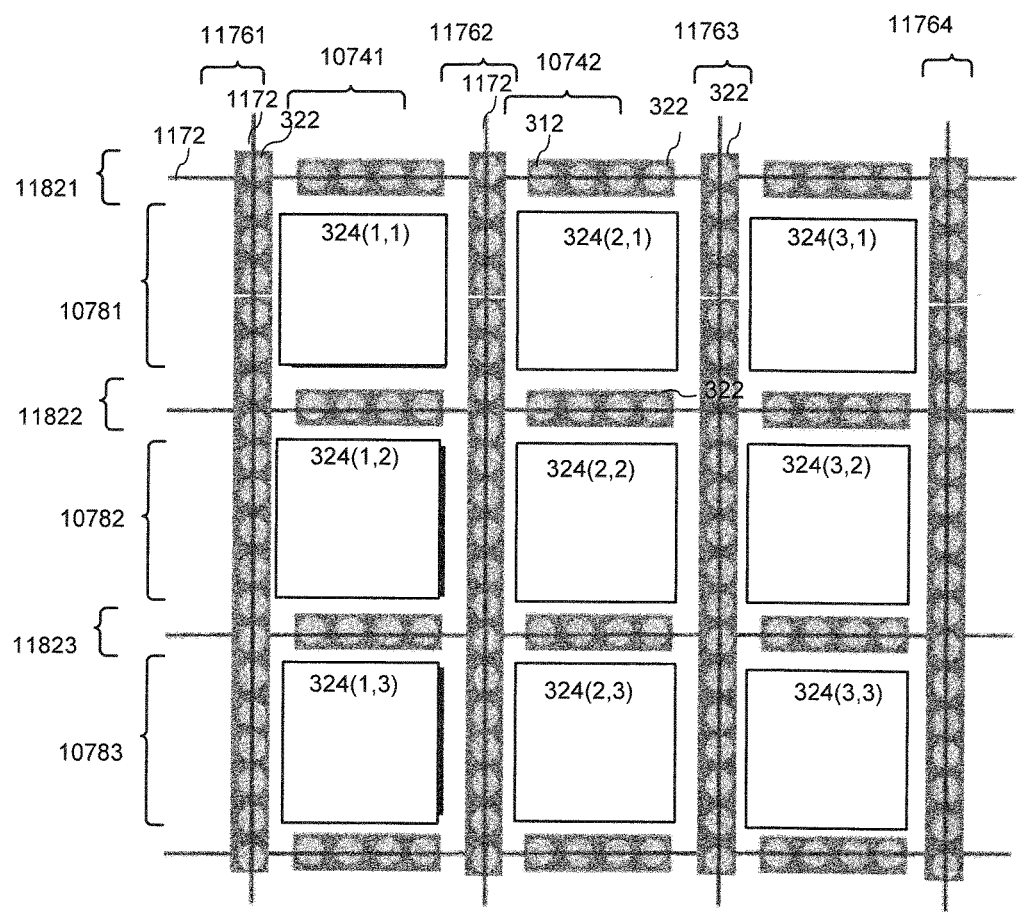

FIGS. 11A and 11B show how electrically conductive line arrangements 322 may be arranged with respect to an array of chip arrangements according to various embodiments, and a method for manufacturing an embedded chip package according to various embodiments.

Top view 1110 of FIG. 11A, shows an n×m array of chip arrangements 324($n,m$) wherein n, m may each be an arbitrary integer number. This arrangement may be similar to that described with respect to FIG. 10A.

Similarly to FIG. 10A, a column 1176, e.g. 11761, 11762, . . . 1176$n$, of one or more of electrically conductive line arrangements 322 may be arranged adjacent each column 1174 of chip arrangements. Similarly, a row 1182, e.g. 11821, 10822, . . . 1082$m$, of one or more of electrically conductive line arrangements 322 may be arranged adjacent each row 1178 of chip arrangements.

Neighboring chip arrangements from neighboring rows may each share an electrically conductive line arrangement 322. For example, a chip arrangement 324(2,1) in row 10781 may be adhered to a first side of electrically conductive line arrangement 322, e.g. over first substrate side 316. A chip arrangement 324(2,2) in row 10782 may be adhered to a second side of electrically conductive line arrangement 322, e.g. over second substrate side 317. It may be understood that the layout of the electrically conductive line arrangement 322 in the rows 1182$x$ may be different from the layout of the electrically conductive line arrangement 322 in the columns 1176$y$.

Dicing may be carried out by separating along dicing lines 1172 through electrically conductive line arrangement 822. However instead of dicing through substrate 314 as with FIG. 9 and FIGS. 10A to 10C, dicing may be carried by dicing through electrically conductive lines 312. For example, dicing may be carried out through the center of electrically conductive lines 312.

FIG. 11B in top view 1120 shows another embodiment, which may be similar to FIG. 11A, except that each column 1176, e.g. 11761, 11762, . . . 1176$n$, may include a single continuous electrically conductive line arrangement 322. Similarly to FIG. 11A, dicing may be carried by dicing through electrically conductive lines 312.

Figure 11C:
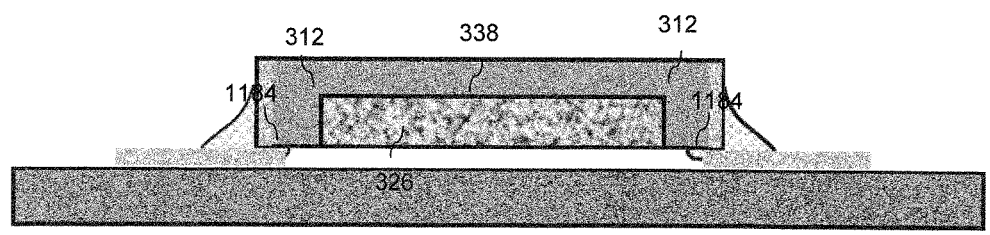

The embodiments described according to FIGS. 11A and 11B may address issues relating to cost and may simplify processing mainly by reducing of pick and place numbers. Particularly, a reduction in the number of electrically conductive lines 312 may be halved. Furthermore the dicing through the electrically conductive lines 312 may mean that the TEVs of the chip package are open solderable sides usable as solder interconnects to a PCB (printed circuit board). Cross section 1130 in FIG. 11C shows solder joints 1184 of such a leadless SMD-Device (surface mount device) to a PCB.

Figure 12:
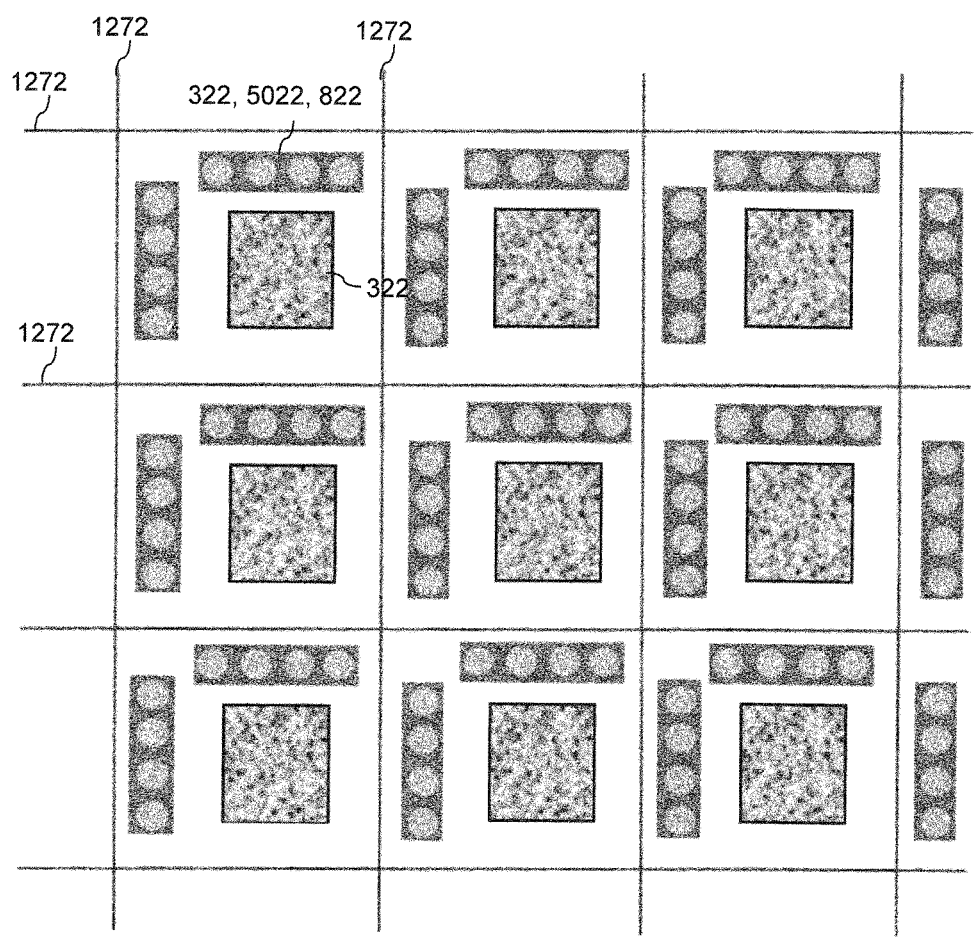
FIG. 12 shows a method for manufacturing an embedded chip package according to various embodiments.

FIG. 12 shows how electrically conductive line arrangements 322 may be arranged with respect to an array of chip arrangements according to various embodiments, and a method for manufacturing an embedded chip package according to various embodiments.

Unlike FIGS. 9, 10A to 10C, 11A and 11B, dicing may be carried out beside the via bars, i.e. outside of electrically conductive line arrangement 822, along dicing lines 1272 as shown in top view 1210 of FIG. 12. However, it may be understood that separating through electrically conductive line arrangement 822, or through electrically conductive lines may result in greater reduction in space and cost.

It may be understood that according to various embodiments, the formation of one or more solder structures may be carried out following the selective formation of electrical interconnects 342 and prior to dicing.

Figure 13:
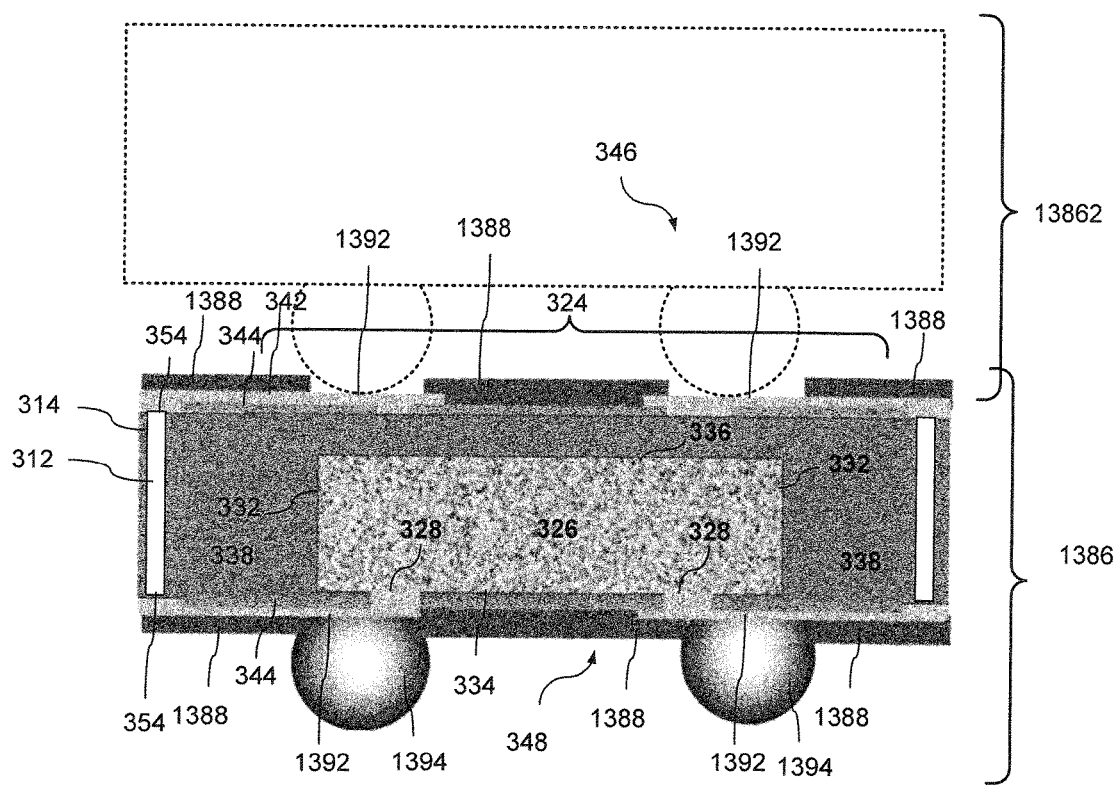
FIG. 13 shows an embedded chip package according to various embodiments.
Figure 14:
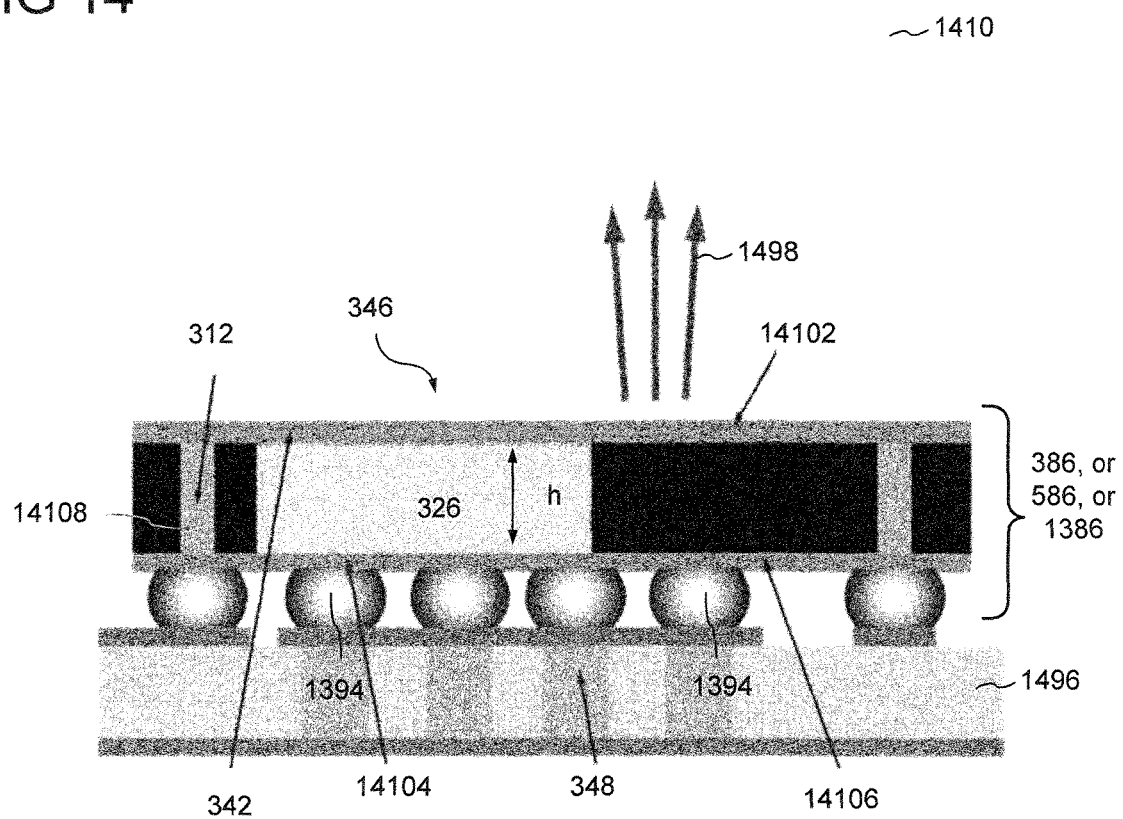
FIG. 14 shows an embedded chip package according to various embodiments.

Methods for manufacturing an embedded chip package with respect to various embodiments are further described with respect to FIGS. 13 and 14. These methods and processes may be applicable, and may be used in various embodiments described herein.

Cross-sectional view 1310 of FIG. 13 shows embedded chip package 1386 according to an embodiment. After the selective formation of electrical interconnects 342 over chip package top side 346 and/or chip bottom side 336, one or more solder stop layers 1388 may be formed over electrical interconnects 342. In other words, solder stop layers 1388 may be formed over chip package top side 346 and/or chip bottom side 336 and may at least partially cover electrical interconnects 342. Selective patterning and/or lithography may be carried out to ensure that one or more portions 1392 of each electrical interconnect 342 may be exposed, i.e. not covered by solder stop layer 1388. Solder structures 1394, e.g. solder balls and/or solder bumps may be formed over some of the one or more portions 1392. For example, solder structures 1394 may be formed over the portions 1392 on one of chip package top side 346 and chip bottom side 336. In the embedded chip packages of FIG. 13, FIG. 3E and FIG. 5C, solder structures 1394 may be formed over portions 1392 on chip package bottom side 348.

The other of chip package top side 346 and chip bottom side 348 may be free from solder structures 1394, e.g. in the embedded chip packages of FIG. 3E and FIG. 5C, chip package top side 346 may be free from solder structures. In some embodiments, as shown in FIG. 13, portions 1392 may be used as landing pads. In some embodiments, solder structures from at least one further chip package 13862 may be stacked over portions 1392 at chip package top side 346 in a package-on-package (ePOP) arrangement. Further chip package 13862 may include, for example a memory and/or one or more passives or at least one further chip. In other embodiments, portions 1392 may be used as electrical contacts for antennas and/or passive devices and/or MEMS-devices and/or bare dies flip chipped and/or wirebonded and/or other components.

According to some embodiments, as shown in cross-sectional view 1410 of FIG. 14, solder structures 1394 may be electrically connected to a connecting structure 1496. Connecting structure 1496 may include for example, a printed circuit board (PCB) according to some embodiments. According to other embodiments, connecting structure 1496 may include, for example, an interposer.

As shown in FIG. 14, at least one of embedded chip packages 386, 586, 1386, may be mounted over connecting structure 1496, e.g. a PCB. For example, solder structures 1394 formed on chip package bottom side 348 may be electrically connected to a PCB. According to some embodiments, chip 326 may include a monolithic microwave integrated circuit (MIMIC) chip. Chip package top side 346 may be substantially free from solder structures. Radiation from the embedded chip package may radiate in a direction 1498 away from chip package top side 346. For example, radiation may be away from chip top side 334. The chip package may even include an integrated antenna 14102 which may be integrated into chip package top side 346. A folded antenna design 14102 on chip package top side 346 and/or chip package and bottom side 348 may be enabled.

The MIMIC chip may have a height, h, which may be about 150 μm; e.g. greater than or equal to 150 μm. A backside metallization layer 14104 may be formed over chip bottom side 336. The chip package may even include a reflector 14106 which may be integrated into chip package top side 348.

According to various embodiments, the electrically conductive line arrangements, e.g. 322, 522, 822, may be designed with matching RF-line, e.g. strip-lines and/or coplanar line.

According to some embodiments, electrically conductive lines 312 may include one or more devices 14108, for example, integrated passive devices. According to some embodiments, electrically conductive lines 312 may include one or more embedded devices 14108, e.g. integrated circuits; discrete passives, e.g. resistors, capacitors and/or inductors; and/or microelectromechanical (MEMS) structures.

It may be understood the electrically conductive line arrangements, e.g. 322, 522, 822, may be manufactured based on different technologies, such as eWLB; or eWLB with embedded chips; or eWLB with top and bottom redistribution layers (RDL), such as multilayer RDL. Any laminates or isolated metal substrates may be used. Active or passive Si or any other semiconductor material, ceramic. Electrically conductive line arrangement 322 may also be integrated well and easily with different technologies. For example, chip arrangement 324 may include or be based on technologies such as eWLB. In some embodiments, chip arrangement 324 may be based on eWLB with embedded chips. The attachment or adhesion of electrically conductive line arrangements 322 with chip arrangement 324 may mean that processes used normally with eWLB may be modified or adapted for use with electrically conductive line arrangements 322, 522, 822. For example, the formation of top and bottom redistribution layers (RDL) and/or multilayer RDL over or directly on electrically conductive line arrangements 322. Furthermore, laminates and/or isolated metal substrates may also be used for manufacturing the embedded chip packages.

According to various embodiments, a condition for reliable manufacturing of the embedded chip package is that the ratio of height to length and/or height to width between the electrically conductive line arrangements 322, 522, 822 and the chip arrangement may be such that the electrically conductive line arrangements 322, 522, 822 may be fixed at the determined position well enough during embedding. For example, the dimensions of the electrically conductive line arrangements 322, 522, 822 should fit well to the dimensions of the chip arrangements 324.

Various embodiments provide an embedded chip package, e.g. 386, 586, 1386. Each embedded chip package may include chip arrangement 324, wherein chip arrangement 324 may include chip 326 and one or more contact pads 328. Embedded chip package 1386 may include an electrically conductive line arrangement, e.g. at least one of electrically conductive line arrangement 322, 522 and 822. Each electrically conductive line arrangement may include one or more successive layers 556 electrically conductive lines 312 formed over first substrate side 316. Each layer 556 may include a plurality of substantially parallel electrically conductive lines 312. Each layer 556 may be covered by electrically insulating material 318 at least partially surrounding electrically conductive lines 312. A surface of electrically insulating material 318 may be adhered to chip arrangement 324. Electrically conductive lines 324 may be arranged proximate to a side wall 332 of chip 326. At least one electrical interconnects 342 may be disposed over chip arrangement 324. At least one electrical interconnects 342 may electrically connect at least one electrically conductive line 312 to at least one contact pad 328.

Various embodiments provide an embedded chip package, e.g. 386, 586, 1386. Each embedded chip package may include chip arrangement 324 including chip 326. Each embedded chip package may include electrically conductive line arrangement, e.g. 322, 522, 822, including a layer of substantially parallel electrically conductive lines 312. Electrically conductive line arrangement e.g. 322, 522, 822, may be adhered to a side of the chip arrangement 324, wherein electrically conductive lines 312 may be parallelly aligned to a side wall 332 of chip 326; the electrically conductive line arrangement e.g. 322 may be vertically aligned to a top side 336 of a chip 326. At least one electrical interconnect 342 may be disposed over chip arrangement 324 and electrically conductive line arrangement e.g. 322, 522, 822. The at least one electrical interconnect 342 may electrically connect at least one electrically conductive line 312 to chip 326.

Various embodiments provide a method for manufacturing an embedded chip package. The method may include forming electrically conductive lines over a substrate; placing the substrate next to a chip arrangement comprising a chip, the chip including one or more contact pads, wherein one or more of the electrically conductive lines are arranged proximate to a side wall of the chip; and forming one or more electrical interconnects over the chip arrangement to electrically connect at least one electrically conductive line to at least one contact pad.

In various embodiments, the method may further include forming an electrically insulating material over the substrate and at least partially surrounding each of the electrically conductive lines.

In various embodiments, the electrically conductive lines are formed over the substrate using a planar deposition; and singulated electrically conductive line arrangement out of the substrate is turned so that the electrically conductive lines are facing the side wall of the chip.

In various embodiments, the electrically conductive lines are one of substantially parallel to each other and arranged with an angle to each other.

In various embodiments, each of the electrically conductive lines may include a metal.

In various embodiments, each of the electrically conductive lines may include copper.

In various embodiments, the substrate may include an electrically insulating material.

In various embodiments, the substrate may include at least one material from the following group of materials, the group of materials consisting of: mold compound, laminate, ceramic, liquid crystal polymer, semiconductor and isolated metal substrates.

In various embodiments, the electrically insulating material may include at least one material from the following group of materials, the group of materials consisting of: mold compound; laminate; duroplast; thermoplast; and ceramic.

In various embodiments, placing the substrate next to the chip arrangement may include adjoining the substrate or the electrically insulating material to the chip arrangement, wherein the electrically insulating material may be adjoined to the chip arrangement via an adhesive material.

In various embodiments, the chip may include one or more chip side walls, and the one or more contact pads may be formed over at least one of a chip top side and a chip bottom side.

In various embodiments, the one or more of the electrically conductive lines may be substantially parallel to a chip side wall.

In various embodiments, the electrically conductive lines may be arranged substantially equidistant from a chip side wall.

In various embodiments, the electrically conductive lines are arranged in a direction extending between the chip top side and the chip bottom side.

In various embodiments, forming one or more electrical interconnects over the chip arrangement may include forming the one or more electrical interconnects over at least one of a chip top side and a chip bottom side.

In various embodiments, forming one or more electrical interconnects over the chip arrangement may include electrically connecting each respective electrically conductive line of the one or more electrically conductive lines to a respective contact pad of the one or more contact pads.

In various embodiments, the method may further include forming an electric circuit on the substrate between the electrically conductive lines. The circuit may include one ore more electronic components, e.g. one or more passive electronic components and/or one or more active electronic components such as e.g. one or more resistors, one or more inductors, one or more capacitors. In various embodiments, the circuit may include a desired functional circuit such as e.g. a balun circuit or a signal divider.

In various embodiments, a method for manufacturing an embedded chip package is provided. The method may include forming one or more successive layers of electrically conductive lines over a first substrate side, each layer comprising a plurality of electrically conductive lines, wherein each layer is covered by electrically insulating material at least partially surrounding the electrically conductive lines; placing a surface of the substrate next to a chip arrangement comprising a chip, the chip comprising one or more contact pads, wherein the electrically conductive lines are arranged proximate to a side wall of the chip; and forming at least one electrical interconnect over the chip arrangement to electrically connect at least one electrically conductive line to at least one contact pad.

In various embodiments, forming one or more successive layers of electrically conductive lines over a first substrate side may include forming a first layer of electrically conductive lines over the substrate and forming a first electrically insulating material over the substrate and at least partially surrounding the first layer of electrically conductive lines.

In various embodiments, forming one or more successive layers of electrically conductive lines over a first substrate side may further include forming a second layer of electrically conductive lines over the first electrically insulating material and forming a second electrically insulating material over the second layer of electrically conductive lines.

In various embodiments, placing the substrate next to the chip arrangement may include adjoining the second electrically insulating material to the chip arrangement.

In various embodiments, the method may further include forming one or more further successive layers of further electrically conductive lines over a second substrate side, each further layer comprising a plurality of substantially parallel further electrically conductive lines, wherein each further layer is covered by further electrically insulating material at least partially surrounding the further electrically conductive lines; adhering a surface of the further electrically insulating material to a further chip arrangement comprising a further chip comprising one or more further contact pads, wherein the further electrically conductive lines are arranged proximate to a side wall of the further chip; and forming at least one further electrical interconnect over the further chip arrangement to electrically connect at least one further electrically conductive line to at least one further contact pad.

In various embodiments, forming at least one electrical interconnect over the chip arrangement may include forming one or more successive rows of electrical interconnects over the chip arrangement, wherein each row may include a plurality of electrical interconnects arranged substantially perpendicular to the one or more successive layers of electrically conductive lines.

In various embodiments, each electrical interconnect from a first row of electrical interconnects electrically couples at least one electrically conductive line from a first layer of electrically conductive lines to at least one first contact pad; and each electrical interconnect from a second row of electrical interconnects electrically couples at least one electrically conductive line from a second layer of electrically conductive lines to at least one second contact pad.

In various embodiments, the method may further include dicing through the substrate to form an individualized embedded chip package.

In various embodiments, each electrically conductive line of the first layer of electrically conductive lines comprises a first width; wherein each electrically conductive line of the second layer of electrically conductive lines comprises a second width; and wherein the first width is different from the second width.

In various embodiments, each electrically conductive line of the first layer of electrically conductive lines is separated from a neighboring electrically conductive line by a first pitch; wherein each electrically conductive line of the second layer of electrically conductive lines is separated from a neighboring electrically conductive line by a second pitch; and wherein the first pitch is different from the second pitch.

In various embodiments, each electrical interconnect from a first row of electrical interconnects is separated from a neighboring electrical interconnect by a first interconnect pitch; wherein each electrical interconnect from a second row of electrical interconnects is separated from a neighboring electrical interconnect by a second interconnect pitch; and wherein the first interconnect pitch is approximately equal to the second interconnect pitch.

In various embodiments, the first interconnect pitch may be approximately equal to the second pitch.

In various embodiments, a pitch between an electrical interconnect from the first row of electrical interconnects and a neighboring electrical interconnect from the second row of electrical interconnects is approximately equal to about half of the second pitch.

In various embodiments, an embedded chip package is provided, which may include: a chip arrangement comprising a chip comprising one or more contact pads; an electrically conductive line arrangement comprising one or more successive layers of electrically conductive lines formed over a first substrate side, each layer comprising a plurality of electrically conductive lines; wherein a surface of the substrate is embedded with the chip arrangement; wherein the electrically conductive lines are arranged proximate to a side wall of the chip; and at least one electrical interconnect disposed over the chip arrangement, the at least one electrical interconnect electrically connecting at least one electrically conductive line to at least one contact pad.

In various embodiments, each layer is covered by electrically insulating material at least partially surrounding the electrically conductive lines.

In various embodiments, widths and pitches of the electrically conductive lines are dimensioned in such a way, that adjacent or neighboring electrically conductive lines cannot be shortened even at maximal allowed lateral offset of electrical interconnects.

In various embodiments, an embedded chip package is provided, which may include a chip arrangement including a chip; an electrically conductive line arrangement comprising a layer of electrically conductive lines; wherein the electrically conductive line arrangement is arranged next to a side of the chip arrangement, wherein the electrically conductive line arrangement is vertically aligned to a side wall of the chip (wherein the electrically conductive lines are parallelly aligned to a side wall of the chip); and at least one electrical interconnect disposed over the chip arrangement and the electrically conductive line arrangement, the at least one electrical interconnect electrically connecting at least one electrically conductive line to the chip.

In various embodiments, the electrically conductive line arrangement is adhered directly to a side of the chip arrangement.

In various embodiments, the one or more of the electrically conductive lines are arranged substantially parallel to a chip side wall.

In various embodiments, the electrically conductive lines are arranged substantially equidistant from a chip side wall.

In various embodiments, the electrically conductive lines are arranged in a direction extending between a chip top side and a chip bottom side.

In various embodiments, the electrically conductive line arrangement may include at least one devices from the following group of devices, the group of devices consisting of: an integrated circuit; a integrated passive device, a discrete passive device, a resistor, a capacitor, an inductor, and a microelectromechanical (MEMS) structure.

In various embodiments, the at least one electrical interconnect is disposed directly on the chip arrangement and the electrically conductive line arrangement.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing an embedded chip package, the method comprising forming a first layer of electrically conductive lines over a substrate to form a pre-formed via arrangement;
dicing the pre-formed via arrangement in a direction perpendicular to the electrically conductive lines;
placing the diced pre-formed via arrangement perpendicularly next to a first side of a chip arrangement comprising a chip, the chip comprising a chip bottom side and a chip top side comprising one or more contact pads, wherein one or more of the electrically conductive lines are arranged proximate to a first side wall of the chip and wherein the diced pre-formed via arrangement is turned so that the electrically conductive lines are facing the first side wall of the chip; and
subsequent to the placing the diced pre-formed via arrangement next to the chip arrangement, forming one or more electrical interconnects over the chip arrangement substantially perpendicular to the electrically conductive lines and substantially parallel to a top side of the chip so as to electrically connect at least one electrically conductive line to at least one of the contact pads.

2. The method according to claim 1, further comprising:
forming an electrically insulating material over the pre-formed via arrangement and at least partially surrounding each of the first layer and/or a second layer of electrically conductive lines.

3. The method according to claim 1,
wherein the first layer of electrically conductive lines are formed over the substrate using a planar deposition.

4. The method according to claim 1,
wherein the first layer and/or a second layer of electrically conductive lines are one of substantially parallel to each other and arranged with an angle to each other.

5. The method according to claim 1,
wherein each of the electrically conductive lines comprises a metal.

6. The method according to claim 1,
wherein the substrate comprises at least one material from the following group of materials, the group of materials consisting of: mold compound, laminate, ceramic, semiconductor, liquid crystal polymer and isolated metal substrates.

7. The method according to claim 2,
wherein the electrically insulating material comprises at least one material from the following group of materials, the group of materials consisting of: mold compound; laminate; duroplast; thermoplast; ceramic; and combinations thereof.

8. The method according to claim 1,
wherein the chip comprises one or more chip side walls, and
wherein the one or more contact pads are formed over at least one of a chip top side and a chip bottom side.

9. The method according to claim 8,
wherein the first layer of the electrically conductive lines are substantially parallel to the chip side wall.

10. The method according to claim 8,
wherein the first layer of electrically conductive lines are arranged substantially equidistant from a chip side wall.

11. A method for manufacturing an embedded chip package, the method comprising:
forming a first layer of electrically conductive lines over a first substrate side to form a pre-formed via arrangement, wherein each electrically conductive line is covered by electrically insulating material at least partially surrounding the electrically conductive lines;
dicing the pre-formed via arrangement in a direction perpendicular to the electrically conductive lines;
placing a surface of the diced pre-formed via arrangement perpendicularly next to a first side of a chip arrangement comprising a chip, the chip comprising a chip bottom side and a chip top side comprising one or more contact pads, wherein the first layer of electrically conductive lines are arranged proximate to a first side wall of the chip and wherein the diced pre-formed via arrangement is turned so that the electrically conductive lines are facing the first side wall of the chip; and
subsequent to the placing the diced pre-formed via arrangement next to the chip arrangement, forming at least one electrical interconnect over the chip arrangement substantially perpendicular to the successive layers of electrically conductive lines and parallel to a top side of the chip so as to electrically connect at least one electrically conductive line to at least one of the contact pads.

12. The method according to claim 11,
further comprising forming a first electrically insulating material over the substrate and at least partially surrounding the first layer of electrically conductive lines.

13. The method according to claim 12,
further comprising forming a second electrically insulating material over the second layer of electrically conductive lines.

14. The method according to claim 13,
wherein placing the diced pre-formed via arrangement next to the chip arrangement comprises
adjoining the second electrically insulating material to the chip arrangement.

15. The method according to claim 11, further comprising
forming one or more further successive layers of further electrically conductive lines over a second substrate side, each further layer comprising a plurality of substantially parallel further electrically conductive lines, wherein each further layer is covered by further electrically insulating material at least partially surrounding the further electrically conductive lines;
adhering a surface of the further electrically insulating material to a further chip arrangement comprising a further chip comprising one or more further contact pads, wherein the further electrically conductive lines are arranged proximate to a side wall of the further chip; and
forming at least one further electrical interconnect over the further chip arrangement to electrically connect at least one further electrically conductive line to at least one further contact pad.

16. The method according to claim 11,
further comprising forming one or more successive rows of electrical interconnects over the chip arrangement, wherein each row comprises a plurality of electrical interconnects arranged substantially perpendicular to the first layer of electrically conductive lines.

17. The method according to claim 11, further comprising dicing through the substrate in to form an individualized embedded chip package.

* * * * *